US006913832B2

(12) United States Patent
Fan et al.

(10) Patent No.: US 6,913,832 B2
(45) Date of Patent: Jul. 5, 2005

(54) PROTOTYPING OF PATTERNED FUNCTIONAL NANOSTRUCTURES

(75) Inventors: Hongyou Fan, Albuquerque, NM (US); Gabriel P. Lopez, Albuquerque, NM (US); Charles Jeffrey Brinker, Albuquerque, NM (US); Yunfeng Lu, Metairie, LA (US)

(73) Assignee: Science & Technology Corporation at University of New Mexico, Albuquerque, NM (US)

( * ) Notice: Subject to any disclaimer, the term of this patent is extended or adjusted under 35 U.S.C. 154(b) by 0 days.

(21) Appl. No.: 10/163,425

(22) Filed: Jun. 7, 2002

(65) Prior Publication Data

US 2003/0039744 A1 Feb. 27, 2003

Related U.S. Application Data

(62) Division of application No. 09/838,153, filed on Apr. 20, 2001, now Pat. No. 6,471,761.
(60) Provisional application No. 60/198,756, filed on Apr. 21, 2000.

(51) Int. Cl.[7] .............................................. B32B 25/20
(52) U.S. Cl. ..................... 428/447; 528/39; 528/12; 528/38; 528/30; 528/42; 528/35
(58) Field of Search .............................. 528/39, 12, 38, 528/30, 42, 35; 428/447

(56) References Cited

U.S. PATENT DOCUMENTS 6,365,266 B1 * 4/2002 MacDougall et al.

6,387,453 B1 * 5/2002 Brinker et al.

OTHER PUBLICATIONS

Brinker et al., "Evaporation–Induced Self–Assembly Nanostructures Made Easy," *Advanced Materials*, (1999), 11, No. 7.

Lu et al, "Evaporation–Induced Self–Assembly of Hybrid Bridged Silsesquioxane Film and Particulat Mesophases with Integral Organic Functionality," *J. Am. Chemn. Soc.*(Ju. 2000), 122, 5258–5261.

Lu et al, "Continuous formation of supported cubic and hexagonal mesoporous films by sol–gel dip–coating," *Nature*, vol. 389, (Sep. 25, 1997).

Fan et al., "Rapid prototyping of patterned functional nanostructures," The University of New Mexico Center for Micro–Engineered Materials and Department of Chemical and Nuclear Engineering, Albuquerque, NM 87131, Sandia National Laboratories, Albuquerque, New Mexico 87185, (May 2000).

McDonald, "Functioning Nanostructures Self–Assemble Out of Ink," Posted May 8, 2000, http://www.amtexpo.com/nano/messages/255.html.

* cited by examiner

*Primary Examiner*—Kuo-Liang Peng
(74) *Attorney, Agent, or Firm*—Schwegman, Lundberg, Woessner & Kluth P.A.

(57) ABSTRACT

The present invention provides a coating composition comprising: A coating composition comprising: TEOS; a surfactant; at least one organosilane; HCl; water; and ethanol. The present invention also provides films made from such a coating composition and a method for making such films.

38 Claims, 17 Drawing Sheets

CHEMICAL FORMULAS OF BRIDGED
SILSEQUIOXANE MONOMERS 1-3

(n=2,3,6,8,10)

1

2

3

NANOCOMPOSITE SELF-ASSEMBLY

AFTER POLYMERIZATION AND SURFACTANT REMOVAL 3-d FINITE ELEMENT SIMULATION OF MPL OF BINARY FLUID

| TABLE 2 | | | | | |
|---|---|---|---|---|---|
| PROPERTIES OF CALCINED TEOS//(-Si-CH$_2$)$_2$-Si-) MESOPOROUS THIN FILMS PREPARED WITH 4 wt%Brij-56 SURFACTANT | | | | | |
| FRAMEWORK(TEOS: SILSESQUIOXANE) | THICKNESS (Å) | DIELECTRIC CONSTANT | POROSITY (%) | MODULUS (Gpa) | HARDNESS |
| TB$_1$ (75:25) | 3135 | 2.15 | 56 | 3.5 | 0.35 |
| TB$_2$ (50:50) | 3154 | 2.13 | 53 | 3.7 | 0.39 |
| TB$_3$ (25:75) | 3015 | 1.98 | 56 | 4.3 | 0.48 |

*FIG. 12*

PROTOTYPING OF PATTERNED FUNCTIONAL NANOSTRUCTURES

CROSS-REFERENCE TO RELATED APPLICATIONS

This application is a divisional application of U.S. Patent Application: U.S. patent application Ser. No. 09/838,153, entitled "Prototyping of Patterned Functional Nanostructures" filed Apr. 20, 2001, now U.S. Pat. No. 6,471,761, which claims priority to U.S. Provisional Application No. 60/198,756, entitled "Rapid Prototyping of Patterned Organic/Inorganic Functional Nanostructures" filed Apr. 21, 2000. The entire disclosure and contents of the above applications are hereby incorporated herein by reference

BACKGROUND OF THE INVENTION

1. Field of the Invention

The present invention relates generally to patterned nanostructures, and more particularly to patterned functional nanostructures.

2. Description of the Prior Art

Marine organisms like diatoms and radiolaria provide many examples of intricately organized architectures preserved in silica or calcium carbonate. Such natural microstructures are formed by biomineralization, a templated self-assembly process in which preorganized organic surfaces regulate the nucleation, growth, morphology and orientation of inorganic crystals. To date, a variety of synthetic pathways that mimic aspects of biomineralization have been explored to prepare patterned ceramic materials.

Hierarchical materials assembly strategies have been developed which allowed growing surfactant-templated mesoporous silica in solution route on hydrophobic patterns prepared by micro-contact printing ($\mu$CP). The films formed by this technique are usually noncontinuous and have globular morphologies. In addition it takes days to form nanostructures using $\mu$CP. Oriented mesoporous silica patterns, using a micro-molding in capillary (MIMIC) technique can be made. However, it requires hours to form such ordered structures under electric field.

Although progress has been made in the preparation of a wide variety of patterned ceramic materials, current synthetic methods have several inherent drawbacks from the standpoint of nanotechnology: First, most templating procedures are conducted in time-consuming batch operations often employing hydrothermal processing conditions. Second, the resultant products are typically ill-defined powders, precluding their general use in thin film technologies. Third, procedures developed to date are often limited to forming patterns of pores.

For many envisioned nanotechnologies, it would be desirable to create patterned nanocomposites consisting of periodic arrangements of two or more dissimilar materials. None of the existing technologies provide a means to fulfill the above need.

Soft lithography approaches have been combined with surfactant and particulate templating procedures to create oxides with multiple levels of structural order. However, materials thus formed have been limited primarily to oxides with no specific functionality, whereas for many of the envisioned applications of hierarchical materials, it is necessary to define both form and function on several length scales. In addition the patterning strategies employed thus far require hours or even days for completion.

Such a long processing time is not very useful in further developing nanotechnologies because slow processes are inherently difficult to implement in commercial environments. Hence a rapid method that enables one to form hierarchically organized structures on substrates in a matter of seconds is highly desirable.

SUMMARY OF THE INVENTION

It is therefore an object of the present invention to form hierarchically organized structures on substrates in a matter of seconds.

It is a further object of the present invention to form patterned nanocomposites that will provide materials suitable for use in nanotechnologies.

It is a further object of the present invention to form nanocomposite materials exhibiting multiple levels of structural order and function on multiple length scales.

It is yet another object of the present invention to form homogeneous mesoporous thin-films.

It is yet another object of the present invention to provide a means to form highly oriented particulate mesophases on a substrate.

It is yet another object of the invention to provide approaches to tailor materials structure and function on multiple length scales i.e. micro-, meso-, and macro-scopic scales and at multiple locations for device fabrications.

According to a first broad aspect, the present invention provides a coating composition comprising: TEOS; a surfactant; at least one organosilane; HCl; water; and ethanol.

According to a second aspect of the present invention, there is provided a method for forming a film comprising: providing at least one coating composition comprising: TEOS; a surfactant; at least one organosilane; HCl; water; and ethanol; applying the coating composition on a substrate to form a coating on the substrate; and drying the coating to form a patterned silsequioxane film.

Other objects and features of the present invention will be apparent from the following detailed description of the preferred embodiment.

BRIEF DESCRIPTION OF THE DRAWINGS

The invention will be described in conjunction with the accompanying drawings, in which:

FIG. 12 is a table listing the properties of calcined TEOS//($\equiv$Si—$(CH_2)_2$—Si$\equiv$) mesoporous thin-films made according to the method of present invention;

DETAILED DESCRIPTION OF THE PREFERRED EMBODIMENT

Figure 1:
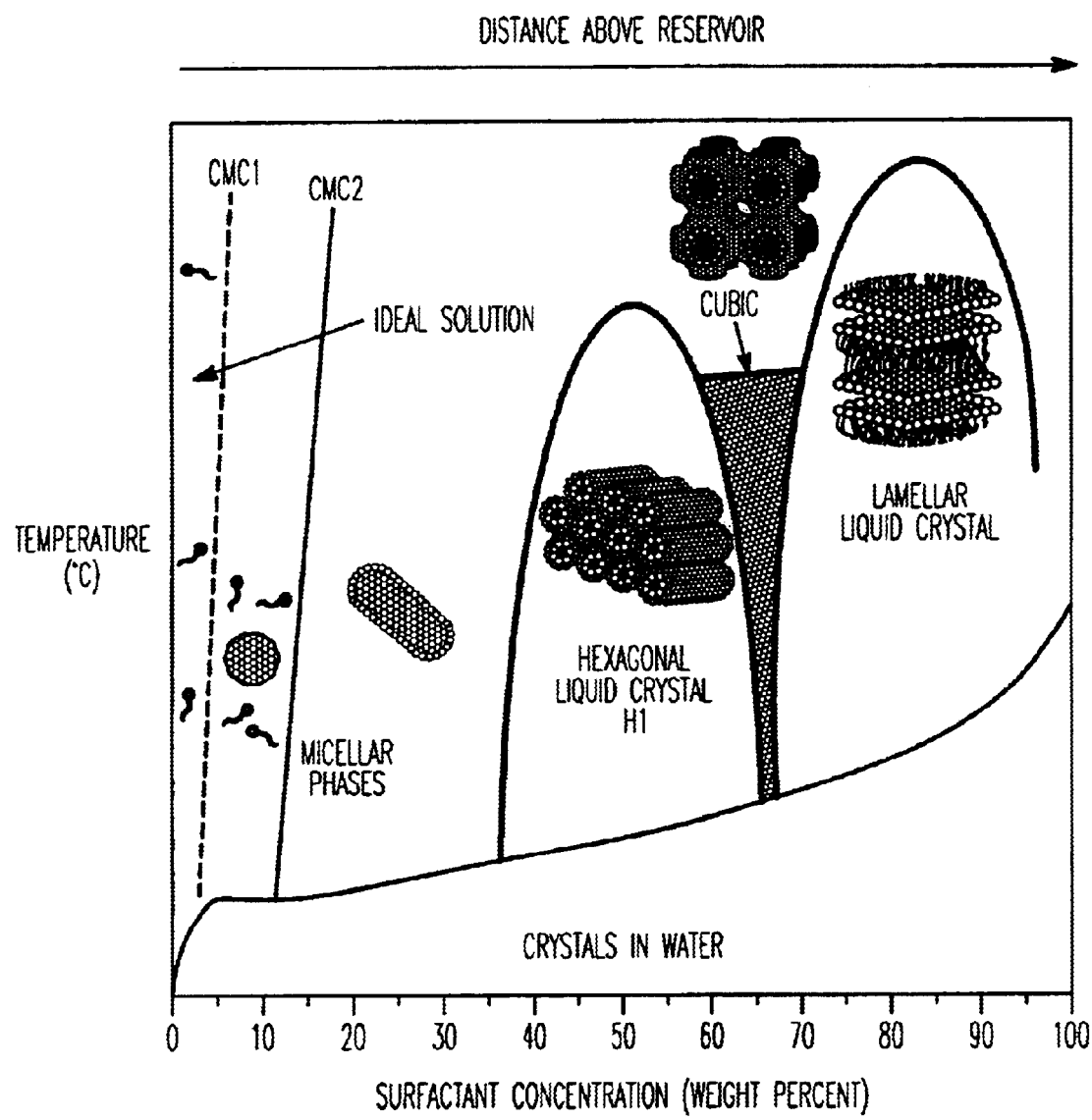
FIG. 1 is a schematic phase diagram for CTAB in water.

It is advantageous to define several terms before describing the invention. It should be appreciated that the following definitions are used throughout this application.

Definitions

Where the definition of terms departs from the commonly used meaning of the term, applicant intends to utilize the definitions provided below, unless specifically indicated.

For the purposes of the present invention, the term "organic additive" refers to functional molecules, polymers, or biomolecules.

For the purposes of the present invention, the term "dye" refers to any dye including molecules that exhibit fluorescent colors.

For the purposes of the present invention, the term "organosilane" refers to any compound having the general formula R'Si(OR)$_3$ wherein R' is a non-hydrolyzable organic functional ligand. When the term "organosilane" is used in reference to coating compositions of the present invention, the term "organosilane" refers to a an organosilane other than TEOS.

For the purposes of the present invention, the term "aminoorganosilane" refers to an organosilane having a non-hydrolyzable organic functional ligand including an amino.

For the purposes of the present invention, the term "nanotechnology" refers to is technology employing nanostructures.

For the purposes of the present invention, the term "nanostructure" refers to structures in the range of 1–1000 nm. These structures are at the confluence of the smallest of human-made devices and the large molecules of living systems.

For the purposes of the present invention, the term "nanoscale science and engineering" refers to the fundamental understanding and resulting technological advances arising from the exploitation of new physical, chemical and biological properties of systems that are intermediate in size, between isolated atoms and molecules and bulk materials, where the transitional properties between the two limits may be controlled.

For the purposes of the present invention, the term "evaporation-induced self-assembly" refers to spontaneous organization of materials through non-covalent interactions induced by evaporation.

For the purposes of the present invention, the term "nanocomposite material" refers to nanoscale composite materials in which different materials are mixed or combined together through physical or chemical interactions.

For the purposes of the present invention, the term "pattern" refers to prototype or structure of matter organization of a material such as a film. This organization may be at atomic level, at molecular level or at macromolecular level.

For the purposes of the present invention, the term "mesophase" refers to surfactant molecules or block copolymers that can form micelles or liquid crystalline phases in water. These liquid crystalline phases include lamellar, hexagonal, cubic structures. The length scale of these structures is a range of 1 nm–50 nm. These liquid crystalline phases are also referred to as mesophase.

For the purposes of the present invention, the term "thin-film" refers to films having a thickness 50 nm–1 µm.

For the purposes of the present invention, the term "mesoporous" refers to porous material having pores in the size range of 1 nm to 50 nm.

For the purposes of the present invention, the term "sol-gel dip coating" refers to a method of preparing thin films where the film is formed on the surface of the silica substrate as a result of the evaporation of the solvent from the solution used to dip the silica substrate.

For the purposes of the present invention, the term "three-dimensional network" refers to a structure in which matter organizes in x, y, z space.

For the purposes of the present invention, the term "matter" refers atoms, molecules and macromolecules.

For the purposes of the present invention, the term "accessible" refers to orientation of the pores organized in a direction perpendicular to the base of the film such that the incoming reactants applied to the surface of the film can enter these pores.

For the purposes of the present invention, the term "featureless" refers to films that lack rough surfaces and discontinuities in other words films that are smooth and homogeneous.

For the purposes of the present invention, the term "conformation" refers to the various patterns present in thin films or nanocomposites made by evaporation-induced self-assembly based processes such as sol-gel dip coating, micropen lithography and ink jet printing. As the process progresses the patterns change from being micelles→micellar composites→periodic pores→hexagonal→cubic lamellar→vesicular etc. All these patterns represent progressive changes in conformations of thin films or nanocomposites.

For the purposes of the present invention, the term "hierarchical material" refers to material having multiple structures and multiple functions.

For the purposes of the present invention, the term "molecular scale" refers to sizes in the range of 1 Å to 10 nm.

For the purposes of the present invention, the term "mesoscale" refers to sizes in the range of 1 nm–1000 nm.

For the purposes of the present invention, the term "macroscale" refers to sizes in the range of 1000 nm to 1 mm.

For the purposes of the present invention, the term "structure" refers to the unit or arrangement or organization of matter through chemical bonds or physical interaction.

For the purposes of the present invention, the term "function" refers to the abilities or properties of matter. For e.g. The materials may have the ability to respond by changing color to changes in pH, temperature, pressure and humidity respectively. These materials would then be called to have the functionality of pH sensitivity, thermo sensitivity, pressure sensitivity and moisture sensitivity respectively; or ability to absorb metal ion or particles; or have hydrophobic or hydrophilic properties.

For the purposes of the present invention, the term "homogeneous" refers to a solution where all the components of the solution are evenly distributed resulting in no discontinuities.

For the purposes of the present invention, the term "calcined" refers to the process of heating the mesophase at high temperatures in the range of 300° C. to 400° C. in presence of different gases to harden the silica structure and "uncalcined" refers to the mesophase that has not been hardened by heating in the above manner.

For the purposes of the present invention, the term micropen lithography refers to patterns made by a micro-pen approach.

For the purposes of the present invention, the term "ink jet printing" refers to any conventional ink jet printing process and any process for the controlled deposition of droplets of a liquid composition or ink on a substrate. In general ink jet printing deposits a droplets of a liquid composition in a pattern controlled by a computer or other control device.

For the purposes of the present invention, the term "selective de-wetting" refers to deposition of a coating composition/film only on one or more selective regions. For example a sol solution may only deposit on a hydrophilic region.

Description

The use of new technologies based on nanoscale machines and devices will play an increasing role in the future. Key to the realization of this nanotechnology world are simple, efficient methods of organizing materials such as molecules, molecular clusters, polymers, or generally speaking, building blocks into precise, predetermined nanostructures that may be preserved in a robust engineering form.

One way of forming nanostructures is through the self-assembly of amphiphillic surfactant molecules or polymers composed of hydrophobic and hydrophilic parts into well-defined supramolecular assemblies. FIG. 1 is a schematic phase diagram for cetyl trimethyl ammonium bromide (CTAB) in water. X-axis shows the increasing surfactant-CTAB concentration expressed as weight percent. Temperature in ° C. is represented by the Y-axis. The arrow denotes evaporation-driven pathway during dip-coating, aerosol processing. FIG. 1 shows a solution of CTAB in aqueous solution above the critical micelle concentration (cmc), surfactants assemble into micelles, spherical or cylindrical structures that maintain the hydrophilic parts of the surfactant in contact with water while shielding the hydrophobic parts within the micellar interior. Further increases in surfactant concentration result in the self-organization of micelles into hexagonal, cubic, or lemellar mesophase. Such detergent mesophases do not themselves represent robust engineering materials suitable for nanotechnologies.

About a decade ago it was discovered that surfactant self-assembly conducted in aqueous solutions of soluble silica species results in spontaneous co-assembly of silica-surfactant mesophases. Surfactant removal creates periodic mesoporous solids essentially silica fossils of the liquid-crystalline (LC) assembly. Over the last few years this work has been extended to produce a wide compositional range of mesoporous solids, and using a variety of surfactants, the pore sizes have been varied in the range of 1 nm to over 10 nm. Despite excellent control of pore size, early mesoporous materials were made in the form of powders, precluding their use in thin film applications like membranes, low dielectric constant inter-layers, and optical sensors.

Stable, supported, mesoporous silica films were made where substrates were introduced into silica/surfactant/solvent systems used to prepare bulk hexagonal mesophases. The initial surfactant concentrations $c_o$>cmc. Under these conditions, hexagonal silica-surfactant mesophases are nucleated on the substrate with pores oriented parallel to the substrate surface. Growth and coalescence over a period of hours to weeks resulted in continuous but macroscopically inhomogeneous films characterized by granular structures on micrometer-length scales.

In addition, by condensation of tetrafunctional silanes $(Si(OR)_4)$ with trifunctional organosilanes $((RO)_3SiR')$ or by inclusion of organic additives, the present invention selectively derivitizes the silica framework with functional R' ligands or molecules. The resulting materials exhibit structure and function on multiple length scales: on the molecular scale, functional organic moieties are positioned on pore surfaces, on the mesoscale, mono-sized pores are organized into 1-, 2-, or 3-dimensional networks, providing size-selective accessibility from the gas or liquid phase, and on the macroscale, 2-dimensional arrays and fluidic or photonic systems may be defined.

A general definition of self-assembly is the spontaneous organization of materials through noncovalent interactions such as hydrogen bonding, Van der Waals forces, electrostatic forces, ππ—ππ interactions, etc. with no external intervention. Self-assembly typically employs asymmetric molecules that are pre-programmed to organize into well-defined supramolecular assemblies. Most common are amphiphilic surfactant molecules or polymers composed of hydrophobic and hydrophilic parts. In aqueous solution above the critical micelle concentration (cmc), surfactants assemble into micelles, spherical or cylindrical structures that maintain the hydrophilic parts of the surfactant in contact with water while shielding the hydrophobic parts within the micellar interior as shown in FIG. 1. Further increases in surfactant concentration result in the self-organization of micelles into periodic hexagonal, cubic, or lamellar mesophases as shown in FIG. 1.

An alternative route to the formation of thin film mesophases is suggested in the context of sol-gel dip coating by careful consideration of the parameters that play a role in evaporation driven pathway. Beginning with a homogenous solution of soluble silica and surfactant prepared in ethanol/water solvent with $c_o$<<cmc, preferential evaporation of ethanol concentrates the depositing film in water and non-volatile surfactant and silica species.

Figure 2A:
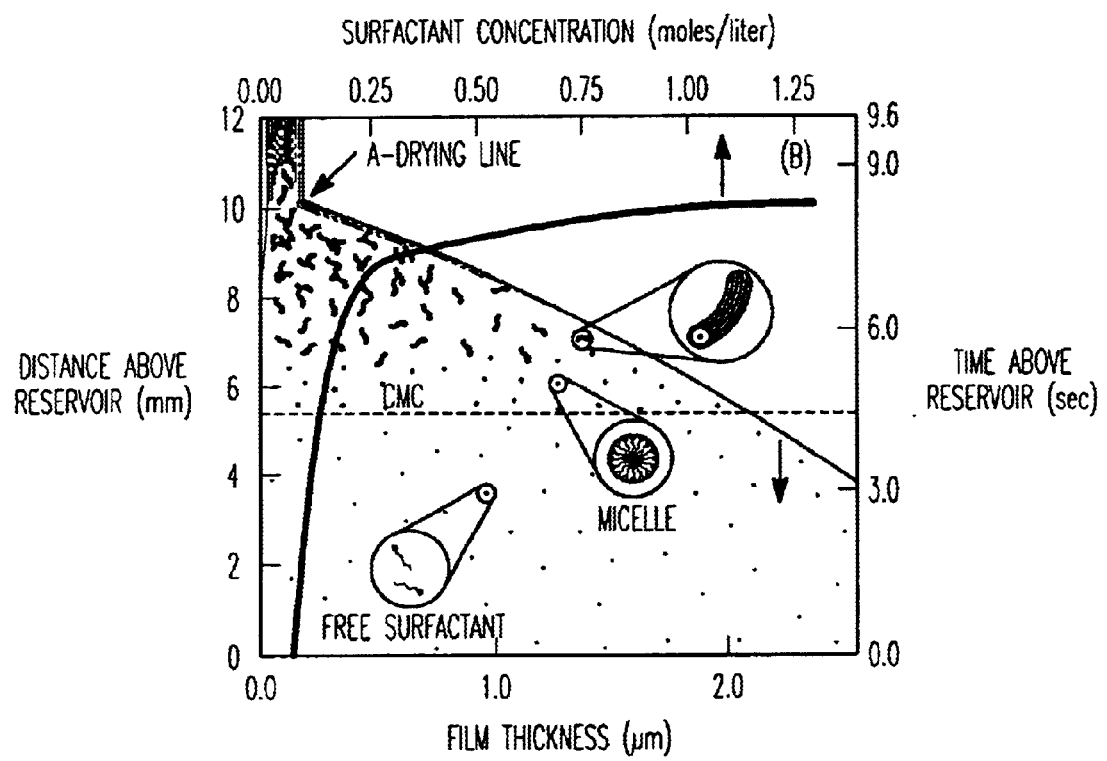
FIG. 2A illustrates a steady-state film thinning profile established during dip-coating of a complex fluid comprising soluble silica, surfactant, alcohol, and water.

FIG. 2A shows a steady-state film thinning profile established during dip-coating of a complex fluid comprising soluble silica, surfactant, alcohol, and water. FIG. 2A is a plot that has the thickness of the film in $\mu m$ plotted along X-axis. The Y-axis on left side shows the distance above the reservoir in mm where concentration of the surfactant is being measured. The Y-axis on right side shows the time in seconds above the reservoir needed for dip coating. The X-axis on top of the plot shows the surfactant concentration in moles/liter. The progressively increasing surfactant concentration drives self-assembly of silica-surfactant micelles and their further organization into LC mesophases. Pre-existing, incipient silica-surfactant mesostructures, which exist at solid-liquid and liquid-vapor interfaces at c<cmc, serve to nucleate and orient mesophase development. The result is rapid formation of thin film mesophases that are highly oriented with respect to the substrate surface.

Figure 2B:
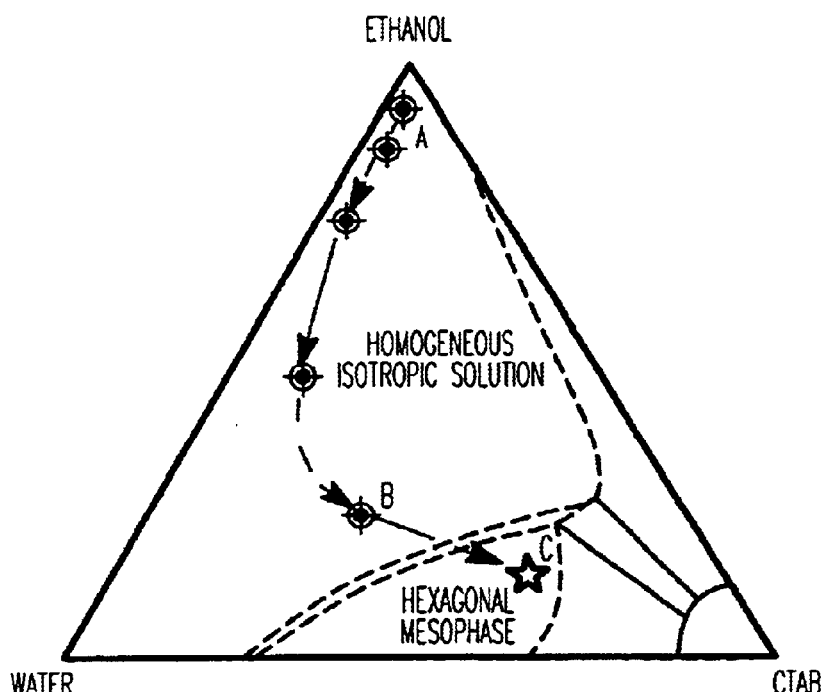
FIG. 2B illustrates the approximate trajectory taken in ethanol/water/CTAB phase space during dip-coating.

FIG. 2B shows that through variation of the initial alcohol/water/surfactant mole ratio it is possible to follow different trajectories in composition space and to arrive at different final mesostructure. The left corner of the triangle represents 100% water, the right corner of the triangle represents 100% CTAB and the tip of the triangle represents 100% ethanol. Point A at the top of the triangle corresponds to the initial composition of entrained solution, point B is near the drying line, and point C corresponds to the dried film. The dashed line in the FIG. 2B represents composition concentration during dip-coating. The double dashed line represent the region of certain mesophases. The solid arc at the CTAB corner of the triangle represents another region of mesophases. The two solid lines radiating from the solid arc represent yet another region of mesophases. Using CTAB, formation of 1-D hexagonal, cubic, 3-D hexagonal and lemellar silica-surfactant mesophases have been demonstrated In solution (or below point A) surfactant exists as a free molecule. During dip-coating, the solvent evaporates. Above dash line the surfactant micelle is formed. Above the drying line the film is formed with different mesophases dependent on the initial surfactant concentration within the coating solution.

The dip-coating scheme depicted in FIGS. 2A and 2B represents a rapid, dynamic self-assembly process that is completed in 10 sec, conducted in a rather steep concentration gradient. Its steady, continuous nature promotes continuous accretion of micellar or perhaps LC species onto interfacially organized mesostructures. Large, LC domains grow progressively inward from the solid-liquid and liquid-vapor interfaces as depicted in FIG. 2B with increasing distance above the reservoir surface. Deposited films are optically transparent and completely featureless on the micrometer-length scale.

The ability to rapidly organize thin film mesophases is based on suppression of inorganic polymerization during the coating operation. For silicates this is achieved under acidic conditions at a hydronium ion concentration corresponding closely to the isoelectric point of colloidal silica ($[H_3O^+]$ ~0.01). By first turning off siloxane condensation, the cooperative silica-surfactant self-assembly is allowed to proceed unimpeded, and the resulting as-deposited films exhibit LC or semi-solid behavior. Subsequent aging, exposure to acid or base catalysts, or thermal treatment solidifies the silica skeleton, thereby locking in the desired mesostructure.

Evidence for the LC nature of as-deposited films is several-fold: First, using a cantilever beam technique it has been demonstrated that the tensile stress developed during mesophase thin film deposition is in the range of 5–10 MPa. This tensile strength is dramatically less compared to deposition of the same silica sol prepared without surfactants which has the tensile strength of ~200 MPa. This virtual absence of drying stress suggests that the film completely dries prior to solidification i.e., as-deposited films are not solidified. Second, it has been demonstrated that as-deposited mesophase films may be transformed to completely different mesophases e.g., lamellar→cubic. Third, the as-deposited films exhibit self-healing tendencies. These combined LC characteristics make the EISA process robust yet versatile.

Transmission electron micrographs (TEM) of calcined film prepared from CTAB, show large oriented domain of cubic mesophase. Such cubic mesophases are crucial for applications like membranes and sensors because they guarantee pore accessibility and through-film pore connectivity.

An EISA procedure has allowed preparation of poly i.e. bridged silsesquioxane thin-film and particulate mesophases that incorporate organic moieties into periodic, mesostructured frameworks as molecularly dispersed bridging ligands. Capacitance-voltage measurements along with a variety of structural characterization procedures were performed to begin to elucidate structure-property relationships of this new class of surfactant-templated mesophases. A consistent trend of increasing modulus and hardness and decreasing dielectric constant with substitution of the bridged silsesquioxane ($\equiv Si—(CH_2)_2—Si\equiv$) for siloxane ($\equiv Si—O—Si\equiv$) in the framework is observed. This evidence suggested that the introduction of integral organic groups into the frameworks of mesoporous materials may result in synergistic properties, promising an unprecedented ability to tune properties and function.

Figure 3:
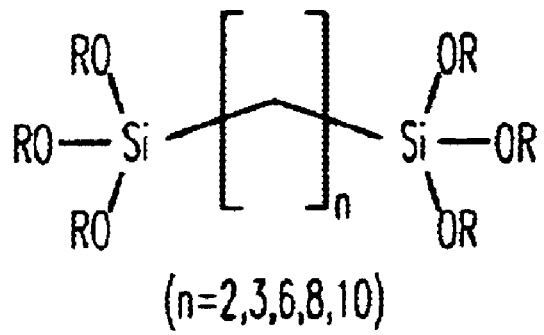
FIG. 3 shows the chemical formulas of bridged silsesquioxane monomers 1–3 used in accordance with a preferred embodiment of the present invention.
Figure 3:
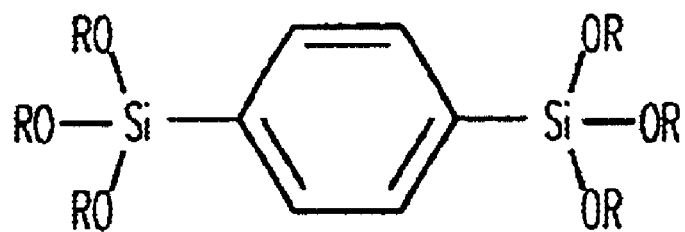
Figure 3:
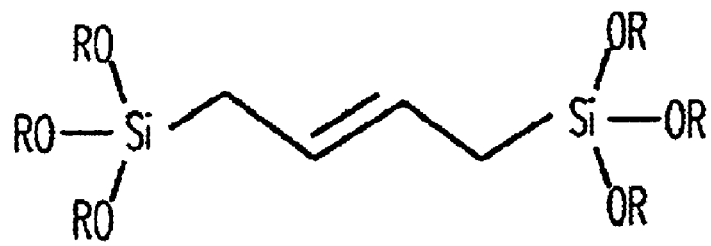

The development of organic modification schemes to impart functionality to the pore surfaces has received much attention since the discovery of surfactant-templated silica mesophases. Most recently, using the general class of compounds referred to as bridged silsesquioxanes $(RO)_3Si—R'—Si—(OR)_3$, formation of a new class of poly i.e. bridged silsesquioxane mesophases (BSQMs) with integral organic functionality has been reported. FIG. 3 illustrates three bridged silsequioxane monomers 1, 2 and 3 that have been used to form BSQMs.

In contrast to previous hybrid mesophases in which organic ligands or molecules are situated on pore surfaces, this class of materials necessarily incorporates the organic constituents into the framework as molecularly dispersed bridging ligands. Although anticipation was that this new mesostructural organization should result in synergistic properties derived from the molecular-scale mixing of the inorganic and organic components, few properties of BSQMs were measured. In addition, samples prepared to date formed granular precipitates, precluding their use in applications such as membranes, fluidics, and low-k dielectric films needed for all foreseeable future generations of microelectronics. An EISA procedure of the present invention provides a method to prepare BSQM films and spherical nanoparticles. Capacitance-voltage measurements along with a variety of structural characterization procedures were performed to begin to elucidate structure-property relationships of this new class of thin-film and particulate mesophases.

The initially reported syntheses of BSQMs involved precipitation in basic aqueous media followed by aging for periods up to several days. To form homogeneous films two requirements are there. Precipitation is to be avoided and self-assembly process is to be accomplished within the brief time span of the dip- or spin-coating operation lasting at most several seconds. To meet these requirements, a dilute, homogeneous, ethanolic solution is prepared that suppress silica/surfactant self-assembly and employ acidic conditions that retard siloxane condensation. The details of this EISA procedure of the present invention that provides a method to prepare BSQM films and spherical nanoparticles that incorporate organic moieties into periodic, mesostructured frameworks as molecularly dispersed bridging ligands are described in Example 1 below.

Figure 4:
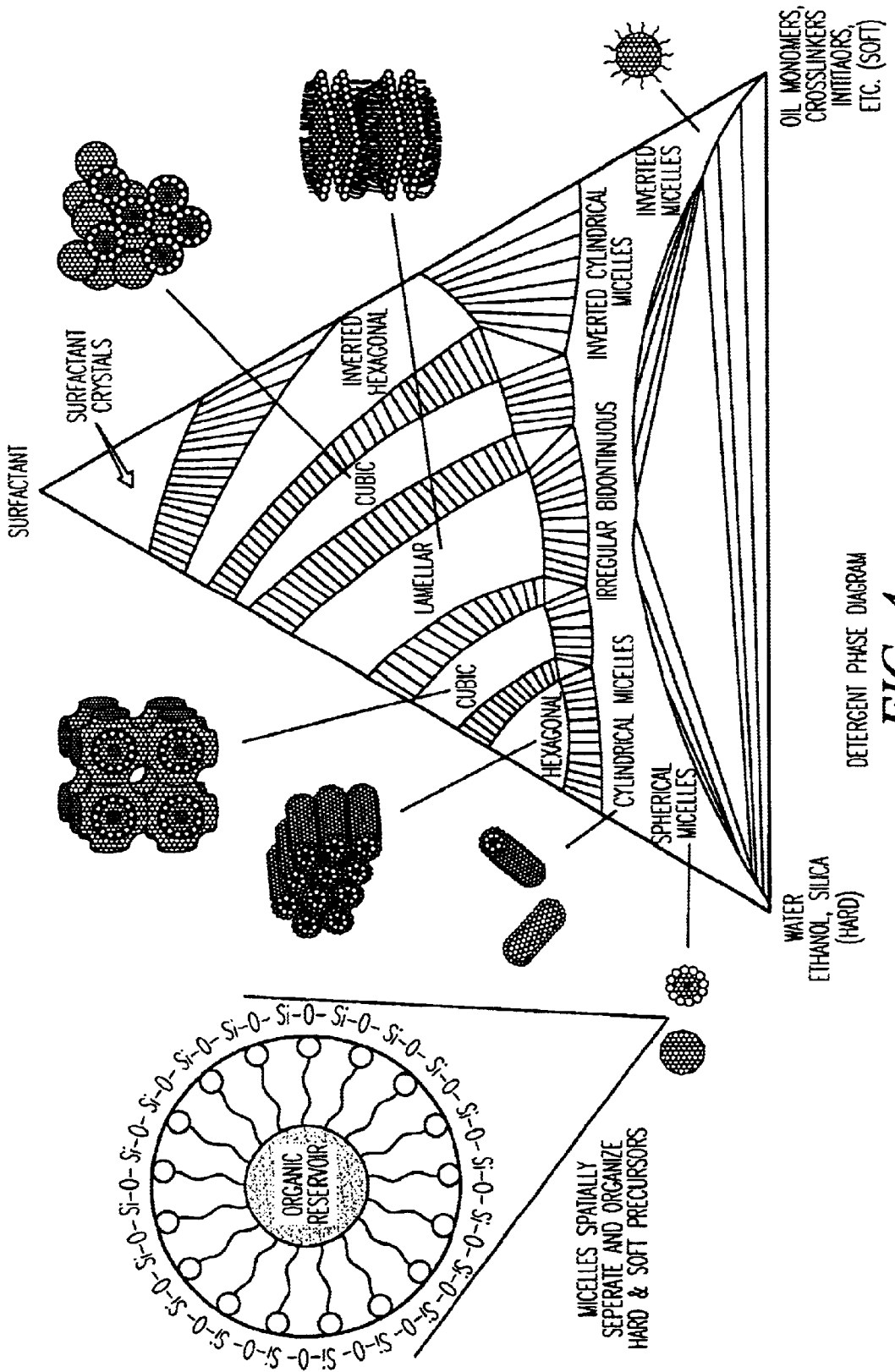
FIG. 4 is a schematic illustration of a detergent phase diagram using surfactant-oil-water combination.

Nanocomposite self-assembly represents an extension of the EISA process described above. Using the generic detergent phase diagram shown in FIG. 4 as a conceptual guide, oil is used to represent a wide variety of hydrophobic, organic precursors and reagents such as monomers, crosslinkers, oligomers, functionalized polymers, initiators, etc. In a process not so unlike washing dishes, micelle formation is used to spatially separate and organize organic precursors and inorganic precursors. These organic precursors are sequestered within the hydrophobic micellar interiors and inorganic precursors are organized around the hydrophilic micellar exteriors. Further self-organization of micelles into periodic hexagonal, cubic, or lamellar mesophases simultaneously positions both the organic and inorganic precursors into precise 3-D arrangements. Combined organic/inorganic polymerization locks in the nanocomposite architecture and covalently bonds the organic/inorganic interface. The beauty of nanocomposite self-assembly approach of the present invention is its simplicity and efficiency: it provides a method to rapidly prepare laminated organic/inorganic composites since many hundreds of alternating organic/inorganic layers can be assembled in seconds.

Figure 5A:
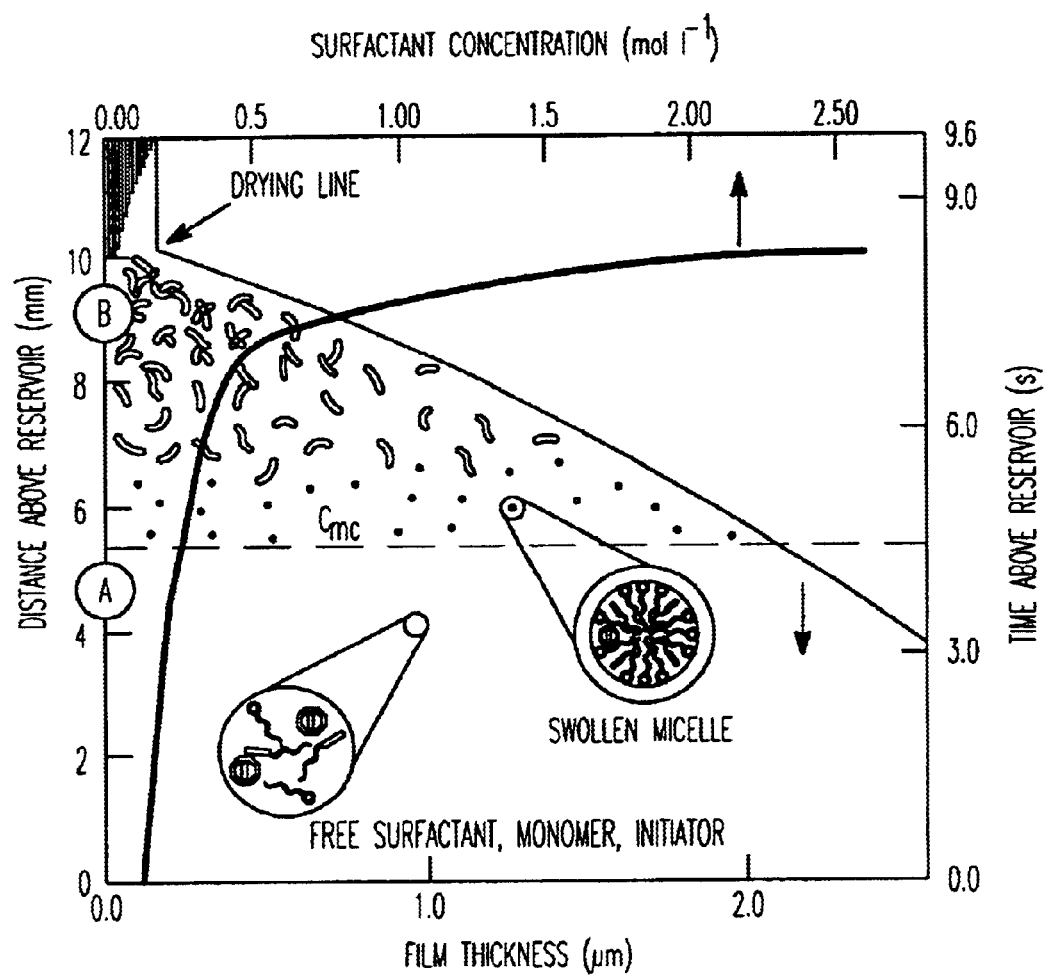
FIG. 5A is a schematic illustration of self-assembly of organic-inorganic nanolaminates during dip-coating showing the hypothetical arrangement of surfactant, monomer, crosslinker, and initiator adjacent to an oligomeric silica layer.
Figure 5B:
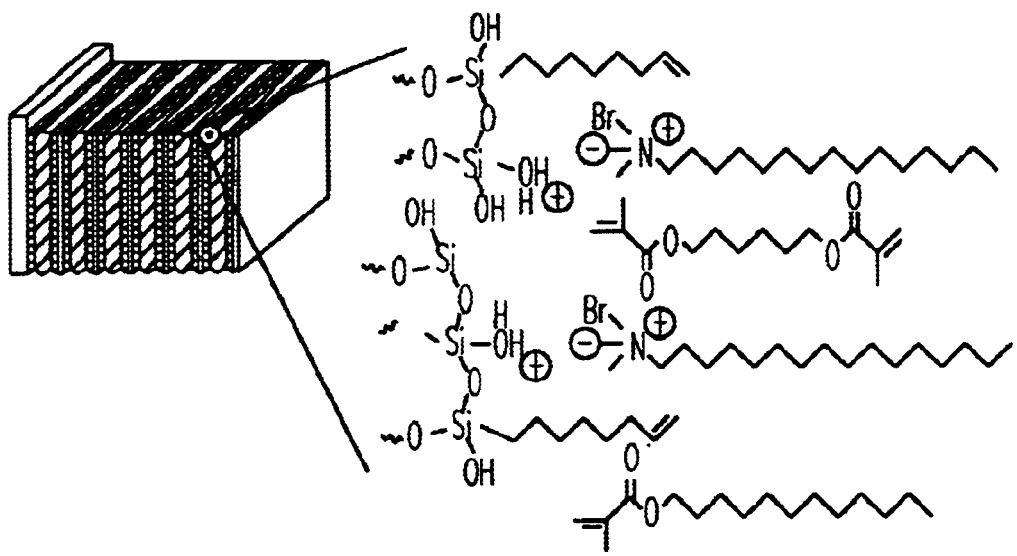
FIG. 5B illustrates the hypothetical structure of covalently bonded silica/poly (dodecylmethacrylate) nanocomposite.
Figure 5B:
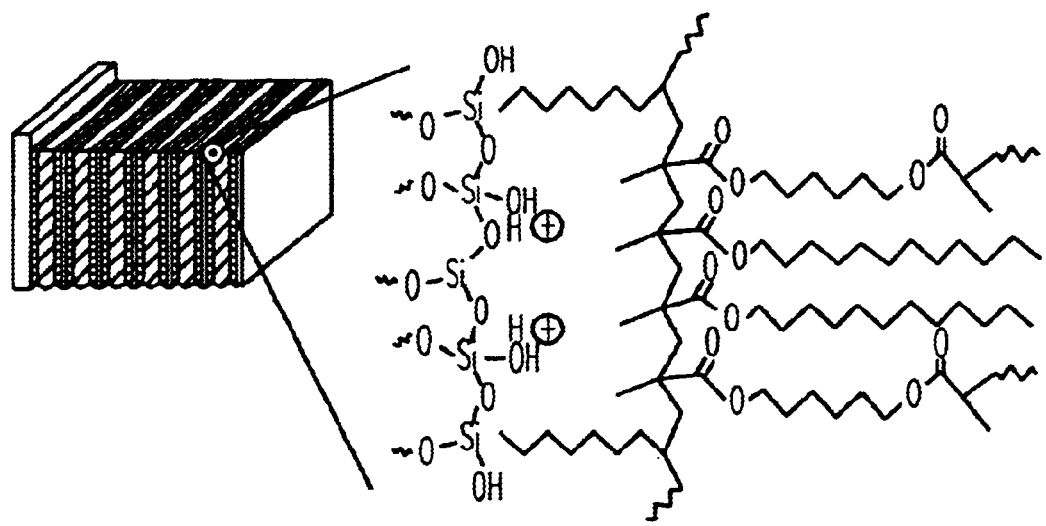

Nanocomposite self-assembly is driven by evaporation during film deposition. Schematic illustration of self-assembly of organic-inorganic nanolaminates during dip-coating is shown in FIG. 5A. Nanocomposite self-assembly begins with a homogeneous solution of soluble silicates, surfactant, organic monomers, and photo or thermal initiators prepared in ethanol/water solvent with $c_o$<cmc. During coating, preferential evaporation of ethanol that is used initially to solubilize the organic precursors and homogenize the solution, progressively enriches the concentrations of water, HCl and the nonvolatile solution constituents within the depositing film. The increasing concentrations of surfactant and water cause the surfactant concentration to exceed the cmc, resulting in micelle formation and concurrent partitioning of the organic precursors and initiators into the micellar interiors and the inorganic precursors surrounding the micellar exteriors. As confirmed by optical probe studies, see FIG. 5A, continued evaporation promotes co-assembly of these species into LC mesophases, thereby simultaneously organizing both the organic and inorganic precursors into the desired laminated form. Photo or thermally induced polymerization of the organic monomers and continued inorganic polymerization complete the composite assembly process as shown in FIG. 5B.

In a preferred embodiment, the present invention provides a method for forming a patterned silsequioxane film by applying a coating composition comprising: TEOS; a surfactant; at least one organosilane; HCl; water; and ethanol on a substrate to form a coating and then drying the coating to form a patterned silsequioxane film. Preferably, no additional heating is required to form a film of the present invention.

Preferred organosilanes for use in the method of the present invention include: tridecafluoro-1,1,2,2,-tetrahydrooctyltriethyoxysilane (TFTS), mercaptopropyltrimethyoxysilane (MPS), aminoorganosilane, aminopropyltrimethyoxysilane (APS), $(H_5C_2O)_3SiCH_2CH_2Si(OC_2H_5)_3$; and 3-(2,4,-dinitrophenylamino)propyltriethoxysilane has the following formula:

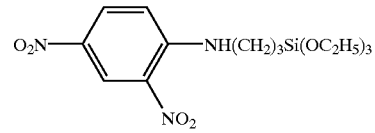

Other organosilanes may also be used in the coating composition and method of the present invention including: cytochrome c, oil blue N, etc. In addition, dye coupled organosilanes may be used in the method of the present invention such the dye coupled dye coupled-aminopropyltrimethyoxysilane. Suitable dyes for coupling with an organosilane include: rhodamine B, molecules with active esters, carboxylic acid, or isothiocyanantes groups, etc.

Figure 6:
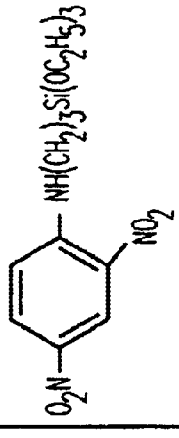
FIG. 6 is a table listing various functional organosilanes and properties of resultant thin films made according to the method of present invention.

As shown Table 1 of FIG. 6 the incorporation of the listed organosilanes into thin films results in films containing pores organized in 3-dimensional networks or cubic arrangements. The pore sizes of the mesophases made with the above organosilanes range from 21 Å to 40 Å.

In one preferred coating composition of the present invention, the ratio of Si:ethanol:water:HCl:surfactant:organosilane is 1:22:5:0.004:0.093–0.31:0.039–0.8:2.6× $10^{-5}$. In another preferred coating composition of the present invention in which an organic additive is used, the ratio of Si:ethanol:water:HCl:surfactant:organosilane:organic additive is 1:22:5:0.004:0.093–0.31:0.039–0.8:2.6×$10^{-5}$. When the coating composition uses the organosilane $(H_5C_2O)_3SiCH_2CH_2Si(OC_2H_5)_3$ the ratio of Si:EtOH:H$_2$O:HCl:surfactant is preferably 1:22:5:0.004:0.054–0.18.

The surfactant of the present invention may be a cationic surfactant, a nonionic surfactant or an anionic surfactant. A preferred cationic surfactant is cetyltrimethyl ammonium bromide (CTAB). A preferred nonionic surfactant is Brij-56

(polyoxyethylene cetylether). A preferred anionic surfactant is sodium-dodecyl sulfate (SDS). Other surfactants that may be used in the present invention include amphiphilic block copolymers, such as pluronic copolymers.

Preferred organic additives for use in the composition or method of the present invention include: dyes, such as rhodamine B, oil blue N, cytochrome c, etc.

The coating composition of the present invention may be applied to a substrate in a variety of ways, depending on the how the film formed from the coating will be used. For example, the coating composition may be applied to a substrate by dip coating, spin coating, micro-pen lithography, ink jet printing, etc. When multiple coating compositions are applied to a substrate using ink jet printing, different coatings may be stored in different compartments of the inkjet cartridge of the ink jet printer used to apply the coatings. A preferred ink jet printer for use in the method of the present invention is the HP DeskJet 1200C, however, various types of ink jet printers may be adapted for use in the method of the present invention.

In preparing the coating composition of the present invention, an initial composition is formed by mixing TEOS, ethanol, water and HCl together. The initial composition is then preferably heated to a temperature of at least 60° C. for at least 90 minutes. In a preferred embodiment, the initial composition contains TEOS, ethanol, water and HCl in the mole ratio of $1:3.8:1:5\times10^{-5}$. Next, the initial composition is diluted with ethanol to form an ethanol-diluted composition. In a preferred embodiment, the initial composition is diluted at the ratio of 2 volumes of ethanol for every 1 volume of initial composition. The ethanol-diluted composition is then diluted with water and HCl to provide an acidic sol. An organosilane is then added to the acidic sol to form a proto-composition. Finally, a surfactant is added to the proto-composition to form a coating composition of the present invention. Preferably, the coating composition has a surfactant concentration of 0.04 to 0.23 M. An organic additive may also be added to the coating composition by adding the organic additive to the acidic sol along with the organosilane.

For many applications, it is desirable to remove the surfactant from the film of the present invention. The surfactant may be removed from the film by heating the film at a temperature of at least 300° C. to 500° C. for a period of 5 to 300 minutes, this process called calcinations removes the surfactant and also hardens the silica. Depending on the type of film and surfactant used, the removal of surfactant may be done in a $N_2$ atmosphere, an $O_2$ atmosphere, air, $H_2/N_2$ mixed atmosphere, etc.

In order to reduce water adsorption on the film, the film of the present invention may be vapor-treating with a compound such as hexamethyldisilazane. Other suitable compounds that may be used to treat the film of the present invention to reduce water adsorption include methyltrichlorosilane.

The present invention will now be described by way of example.

EXAMPLE 1

The rapid patterning procedures of the present invention use of stable, homogenous coating compositions that upon evaporation undergo self-assembly to form the desired organically-modified silica-surfactant mesophase. In one experiment to demonstrate how a film of the present invention could be formed, a solution was prepared for this purpose contains oligomeric silica sols in ethanol/water solvents at a hydronium ion concentration ($[H_3O^+]$~0.01) designed to minimize the siloxane condensation rate, thereby enabling facile silica/surfactant self-assembly during the brief time span of the writing operation lasting maximum up to several seconds. Surfactants were added at an initial concentration $c_o$ much less than the critical micelle concentration cmc, insuring homogeneity and longevity of the coating composition.

Figure 7A:
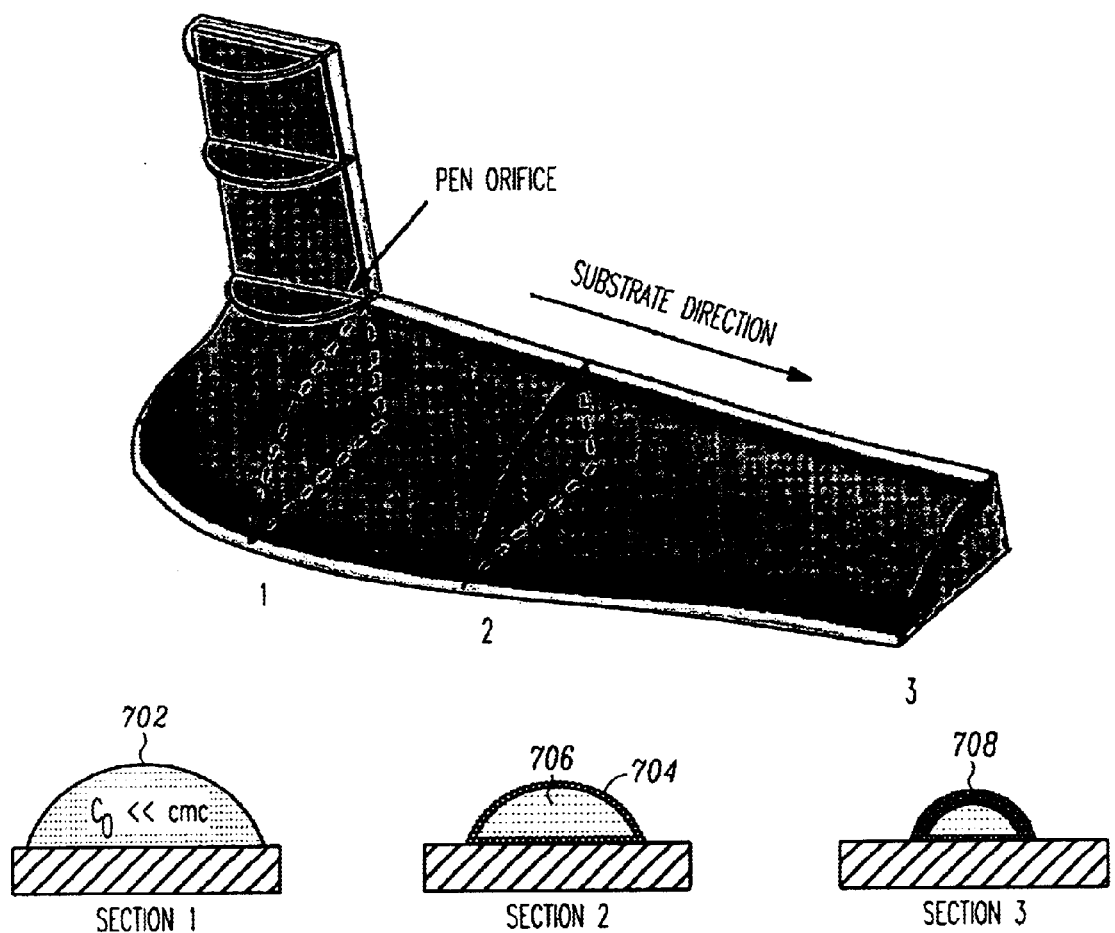
FIG. 7A illustrates micro-pen lithography of a surfactant-templated mesophase utilizing a coating composition of the present invention.
Figure 7B:
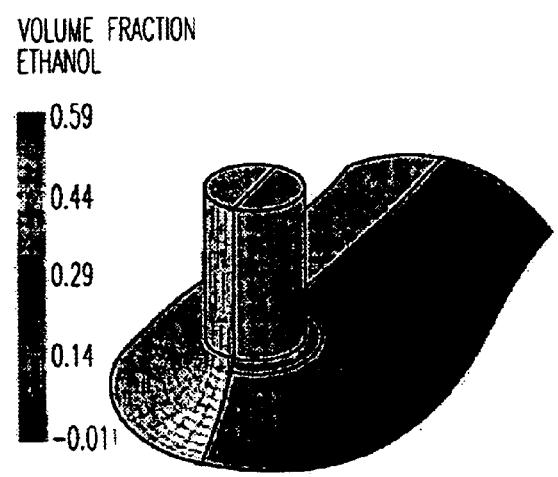
FIG. 7B illustrates the steep 3-D evaporation-induced concentration gradient in a 3-D, binary fluid pattern made using a coating composition of the present invention dispensed on a flat surface using the method of the present invention.

As a pattern of coating composition was delivered onto a surface, preferential evaporation of ethanol causes enrichment of water, surfactant, and silicates, establishing a complex 3-D gradient i.e. a gradient extending both in longitudinal and radial directions, in their respective concentrations. FIGS. 7A and 7B provides a schematic illustration of micro-pen lithography (MPL) of a surfactant-templated mesophase. The 3-D finite element simulation of pen lithography is shown in FIG. 7A. Section 1 of the coating composition that has been delivered onto substrate is very close to the pen orifice has a $c_o$<<cmc and coating composition 702 is liquid. Section 2 is slightly further away from the pen orifice from which the coating composition is being delivered. Section 2 represents the zone where preferential evaporation of ethanol causes enrichment of water, surfactant, and silicates and cmc is exceeded, cooperative silica/surfactant self-assembly creates micelles on surface 704 of coating composition 706. Further evaporation, predominantly of water promotes the continuous self-organization of micelles into silica/surfactant LC mesophases as seen in 708.

Incipient LC domains are nucleated at liquid-vapor interfaces at c<cmc and grow inward along compositional trajectories established by the steep, 3-D evaporation-induced concentration gradient shown in FIG. 7B.

Films according to the present invention were made using the following organosilanes: tridecafluoro-1,1,2,2,-tetrahydrooctyltriethyoxysilane, mercaptopropyltrimethyoxysilane, aminoorganosilane, aminopropyltrimethyoxysilane, $(H_5C_2O)_3SiCH_2CH_2Si(OC_2H_5)_3$; the organosilane of Formula (A) described previously; dye coupled-aminopropyltrimethyoxysilane. Data about the films formed using the above-listed organosilanes is shown in Table 1 in FIG. 6.

The amphiphilic nature of some organosilanes like TFTS listed in Table 1 of FIG. 6, causes them to behave as co-surfactants, positioning the hydrophilic $Si(OR)_x(OH)_{3-x}$ headgroups in close proximity to the silica oligomers where they are incorporated into the framework upon further hydrolysis and condensation, thereby localizing covalently attached R' moieties on the pore surfaces. Hydrophobic but alcohol-soluble organic molecules like rhodamine-B partition into the hydrophobic micellar interiors upon ethanol evaporation and ultimately become compartmentalized within the channel network of the resulting mesophase. Retention of the covalently-attached functional organic moieties after surfactant removal by pyrolysis was confirmed using $^{29}Si$ and $^{13}C$ magic angle spinning NMR spectroscopy. Fluorescence-imaging and UV-visible spectroscopy were used to confirm retention and functionality of optically-active ligands and molecules.

The MPL line width can vary from micrometers to millimeters. It depends on such factors as pen dimension, wetting characteristics, evaporation rate, capillary number and ratio of the rates of coating composition supply and withdrawal. Where capillary number Ca=coating composition viscosity×substrate speed/surface tension and withdrawal=inlet velocity/substrate velocity. The effect of wetting has been demonstrated by performing MPL on substrates pre-patterned with hydrophobic, hydrophilic or mixed SAMs. Generally, line widths are reduced by increasing the contact angle and by reducing the pen orifice dimension and inlet/substrate velocity ratio.

The advantages of MPL are that any desired combination of surfactant and functional silane may be used as coating composition to print selectively different functionalities at different locations. Furthermore, computer-aided design (CAD) may be used to define arbitrary 2-D patterns that can be written on arbitrary surfaces. For example, writing rhodamine containing mesophases (refractive index n=1.2–1.3) on aerogel and emulsion-templated thin films (n=1.03–1.10) has been demonstrated. Such rhodamine containing mesophases may be useful for lasing applications.

When the mesostructure is doped with the laser dye, e.g., rhodamine 6G, amplified spontaneous emission is observed. This is attributed to the mesostructures' ability to prevent aggregation of the dye molecules even at relatively high loadings within the organized high surface area mesochannels of the waveguides.

MPL is best suited to write continuous patterns. Patterned macroscopic arrays of discrete mesostructures can be obtained readily by combining EISA with aerosol processing schemes like ink-jet printing IJP. The IJP process dispenses the coating composition prepared as for MPL as monosized, spherical aerosol droplets. Upon impaction the droplets adopt a new shape that balances surface and interfacial energies. Accompanying evaporation creates within each droplet a gradient in surfactant concentration that that drives radially-directed silica/surfactant self-assembly inward from the liquid-vapor interface. The link to CAD, greater printing resolution achieved compared to standard ink, and the method of the present invention provides an ability to selectively functionalize the coating composition suggests applications in sensor arrays and display technologies.

MPL and IJP are serial techniques. In situations where it is desirable to create an entire pattern with the same functionality, it might be preferable to employ a parallel technique in which the deposition process occurred simultaneously in multiple locations.

Figure 8:
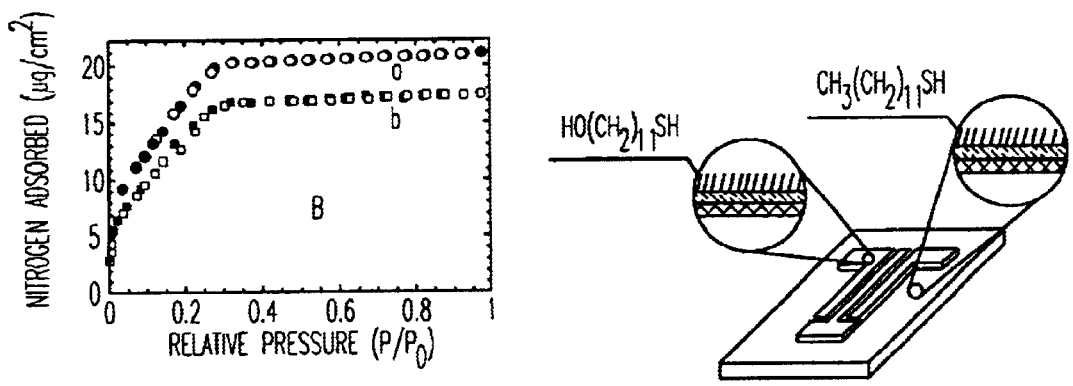
FIG. 8 illustrates the scheme of patterned functional mesostructure formed by selective de-wetting using microcontact printing or electrochemical desorption technique using the method of present invention.
Figure 8:
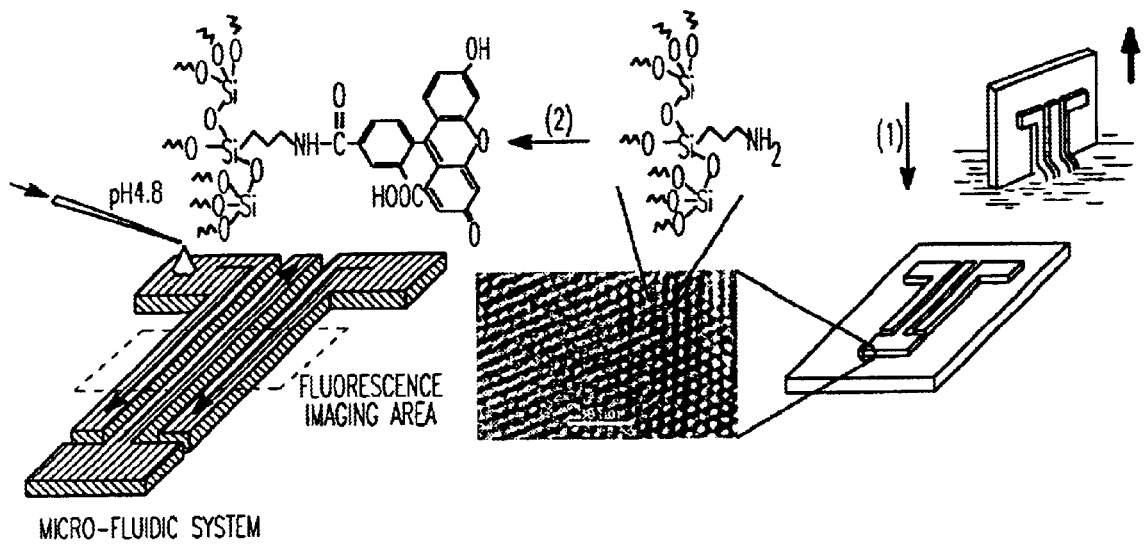

FIG. 8 illustrates dip-coating on patterned SAMs. This rapid, parallel procedure uses micro-contact printing or electrochemical patterning of hydroxyl- and methyl-terminated SAMs to define hydrophilic and hydrophobic patterns on the substrate surface. Then using coating compositions identical to those employed for MPL and IJP, preferential ethanol evaporation during dip-coating enriches the depositing film in water, causing selective de-wetting of the hydrophobic regions and ensuing self-assembly of silica-surfactant mesophases exclusively on the hydrophilic patterns. In this fashion, multiple lines, arrays of dots, or other arbitrary shapes can be printed in seconds. Recent density functional theory calculations have established the ultimate resolution of this differential wetting technique to be 1–2-nm.

Overall the evaporation-induced self-assembly process described here and its elaboration in three different printing procedures of the present invention holds great promise for rapid prototyping of functional fluidic and photonic devices along with displays and sensor arrays. Compared to alternative approaches like MMIC, printing is considerably faster as the printing takes seconds versus 12 hours needed for MMJC and avoids the need for molds, masks, and resists. Finally by using a spectrum of functional coating compositions and interfacing with commercially available software, CAD and rapid transcription of functional micro-systems may soon be a reality.

Method of Preparing Coating Composition Used in the Present Invention

Precursor solutions used as coating compositions were prepared by addition of surfactants (cationic, CTAB; $CH_3(CH_2)_{15}N^+(CH_3)_3Br^-$ or non-ionic, Brij-56; $CH_3(CH_2)_{15}-(OCH_2CH_2)_{10}-OH$), organosilanes ($R'Si(OR)_3$, as shown in Table 1 of FIG. 6), or organic molecules (listed in Table 1 of FIG. 6) to an acidic silica sol prepared from TEOS $[Si(OCH_2CH_3)_4]$. The acid concentration employed in the synthesis procedure was chosen to minimize the siloxane condensation rate, thereby promoting facile self-assembly during printing. In a typical preparation, TEOS $[Si(OCH_2CH_3)_4]$, ethanol, water and dilute HCl (mole ratios: $1:3.7:1:5\times10^{-5}$) were refluxed at 60° C. for 90 min. The sol was diluted with 2 volumes of ethanol followed by further addition of water and HCl. Organosilanes ($R'Si(OR)_3$, where R' is a non-hydrolyzable organic functional ligand, were added followed by surfactants and other optional organic additives listed in see Table 1 of FIG. 6. Surfactants were added in requisite amounts to achieve initial surfactant concentrations $c_o$ ranging from 0.004 to 0.23 M ($c_o$<<cmc). The final reactant molar ratios were: 1 TEOS:22 $C_2H_5OH:5H_2O:0.093-0.31$ surfactant:$0.039-0.7$ organosilanes:$2.6\times10^{-5}$ organic additives.

For the ethane-bridged silsesquioxane, $(H_5C_2O)_3SiCH_2CH_2Si(OC_2H_5)_3$ the neat precursor was diluted in ethanol and mixed with 1–7 wt % CTAB or Brij-56 surfactant followed by addition of an aqueous solution of HCl. The final reactant molar ratios were: Si:EtOH:$H_2O$:HCl:surfactant=1:22:5:0.004:0.054–0.17. It should be noted that co-hydrolysis of organosilanes with TEOS in the initial sol preparation, generally resulted in disordered worm-like mesostructures. After pattern deposition and drying, the surfactant templates were selectively removed by calcination in a nitrogen atmosphere at a temperature sufficient to decompose the surfactant molecules ~350° C. without degrading the covalently-bound organic ligands R'. The integrity of the organic ligands R' was confirmed by $^{29}Si$ and $^{13}C$ MAS NMR spectroscopy or by solvent extraction.

Micropen lithography (MPL) was performed using a Model 400a micropen instrument purchased from Ohmcraft Inc., Pittsford, N.Y. The pen orifice was 50 $\mu$m and the writing speed was 2.54 cm/s. The pattern was designed using AutoCAD 14 software.

Ink jet printing (IJP) was performed using a Model HP DeskJet 1200C printer purchased from Hewlett-Packard Co., San Diego, Calif. The pattern was designed using Microsoft PowerPoint 97 software.

Dip-coating of patterned (hydrophilic/hydrophobic) substrates was performed at a withdrawal speed of 6.6–51 cm/min under ambient laboratory conditions. Hydrophilic/hydrophobic patterns were created by microcontact printing of hydrophobic, n-octadecyltrichlorosilane ($CH_3(CH_2)_{16}SiCl_3$) SAMs on hydrophillic silicon substrates (hydroxylated native oxide) or by a technique involving electrochemical desorption of a hydroxyl-terminated SAM prepared from 11-mercaptoundecanol ($HO(CH_2)_{11}SH$) from patterned, electrically isolated gold electrodes followed by immersion in a 1 mM ethanolic solution of 1-dodecanethiol, $CH_3(CH_2)_{11}SH$.

The rapid prototyping procedures used in the present invention are simple, employ readily available equipment, and provide a link between computer-aided design and self-assembled nanostructures. The ability to form arbitrary functional designs on arbitrary surfaces should be of practical importance for directly writing sensor arrays and fluidic or photonic systems.

Application of the method of the present invention results in formation of multi-functional mesoporous silica films and rapid fabrication of patterned functional nanostructures. Such multi functional mesoporous silica films and patterned functional nanostructures will be useful for numerous applications in the fields of micro-sensor systems, microelectronics, catalysis and waveguides.

EXAMPLE 2

Evaporation-Induced Self-Assembly of Hybrid Bridged Silsesquioxane Film and Particulate Mesophases with Integral Organic Functionality In a typical synthesis procedure, requisite amounts of bridged silsesquioxane monomers shown in FIG. 3 as 1 (from Gelest and triply distilled prior to use), 2 (synthesized according to Shea et al. *J. Am. Chem. Soc.* 1992, 114, 6600–6610), or 3 (synthesized according to Shea et al ibid) were dissolved in ethanol followed by addition of 1–7 wt % surfactant [cationic (CTAB, $CH_3(CH_2)_{15}N^+(CH_3)_3Br^-$), nonionic (Brij-56, $C_{16}H_{33}(OCH_2CH_2)_{10}OH$), anionic (SDS, $C_{12}H_{25}OSO_3^-Na^+$), or block copolymer (P123, $H(OCH_2CH_2)_{20}(OCH(CH_3)CH_2)_{60}(OCH_2CH_2)_{20}OH)$] and an aqueous solution of HCl (0.1–1.0 N). The investigated range of starting compositions was represented by the molar ratios Si:EtOH:$H_2$O:HCl:surfactant=1:22:5:0.004: (0.054–0.17). To evaluate the effect of substitution of bridged silsesquioxanes for siloxanes on the properties of resultant thin-film mesostructures, a series of films was prepared with varying ratios of TEOS and $(EtO)_3Si—(CH_2)_2—Si(OEt)_3$. For this series, the starting compositions are represented by the molar ratios TEOS:1 (n=2): EtOH:$H_2$O:HCl:surfactant=(0.3–3): 1:0.25:0.044:0.7:0.00074. In all cases the initial surfactant concentration ($c_o$) was much less than the critical micelle concentration (cmc), implying mesoscale homogeneity of the starting sols.

Films were prepared by spin- or dip-coating, and nanoparticles were prepared by an aerosol-assisted self-assembly process. In both cases, preferential ethanol evaporation concentrates the sol in water, nonvolatile surfactant, and organically bridged polysilsesquioxane species. By choosing the initial acid concentration to retard the competing process of siloxane condensation, the progressively increasing surfactant concentration to drive self-assembly of polysilsesquioxane-surfactant micelles and their further organization into liquid crystalline mesophases was exploited. Pre-existing, incipient polysilsesquioxane-surfactant mesostructures which exist at solid-liquid and liquid-vapor interfaces at c<cmc, serve to nucleate and orient the mesophase development. The result was formation of thin-film or particulate BSQMs that are oriented with respect to the solid-liquid and or liquid-vapor interfaces in several seconds. Through variation of the shape of the surfactant along with its charge and initial concentration, this evaporation-induced self-assembly route can be used to attain a range of thin-film or particulate mesophases.

Figure 9:
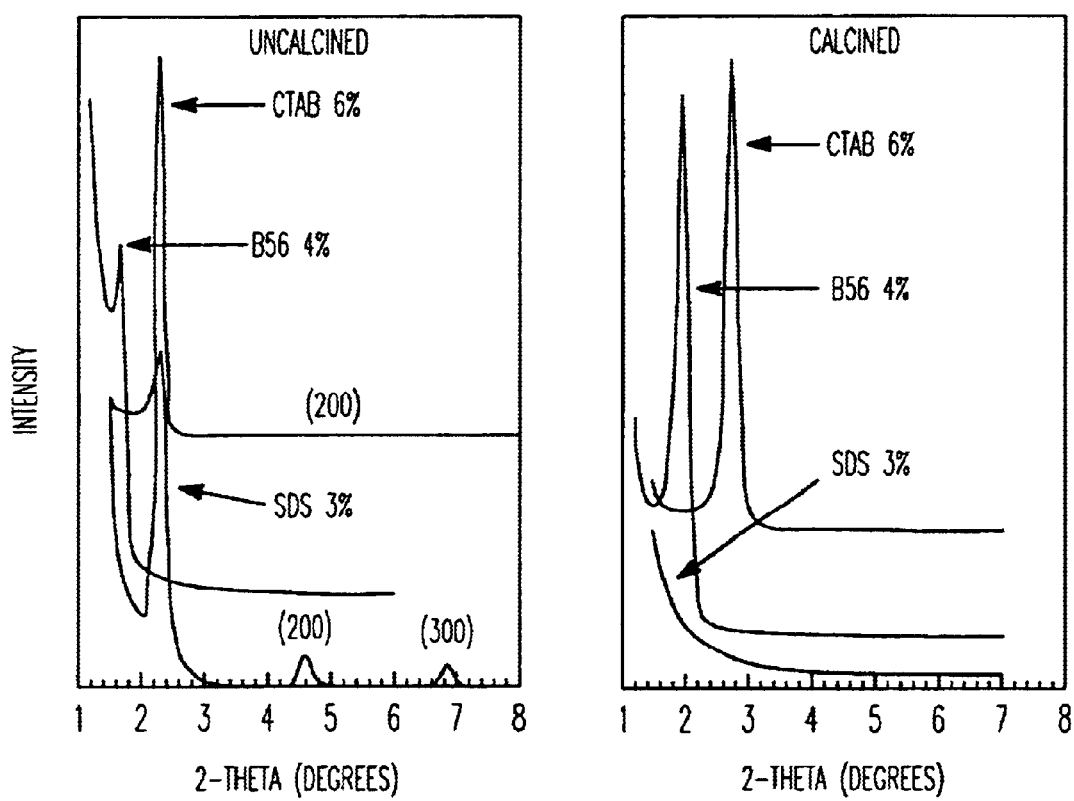
FIG. 9 illustrates X-ray diffraction results of the uncalcined and calcined thin-film mesophases prepared using ethylene-bridged polysilsesquioxane.

FIG. 9 shows X-ray diffraction (XRD) results for thin-film bridged polysilsesquioxane mesophases prepared from the ethylene-bridged silsesquioxane precursor (1 with n=2) with CTAB, Brij-56, or SDS surfactant before and after calcination at 250° C. in $N_2$. The multiple sharp peaks observed for the uncalcined SDS system and the virtual elimination of these peaks after calcination are consistent with an [001]-oriented lamellar thin-film mesophase, as is commonly observed for silica thin-film mesophases prepared from SDS and TEOS. The CTAB and Brij-56 systems are characterized by single intense peaks that shift slightly to higher 2θ values (lower d-spacing) upon calcination. This behavior is similar to that observed previously for hexagonal and cubic thin-film mesophases prepared from TEOS or TEOS plus various organotrialkoxysilane co-monomers.

Figure 10A:
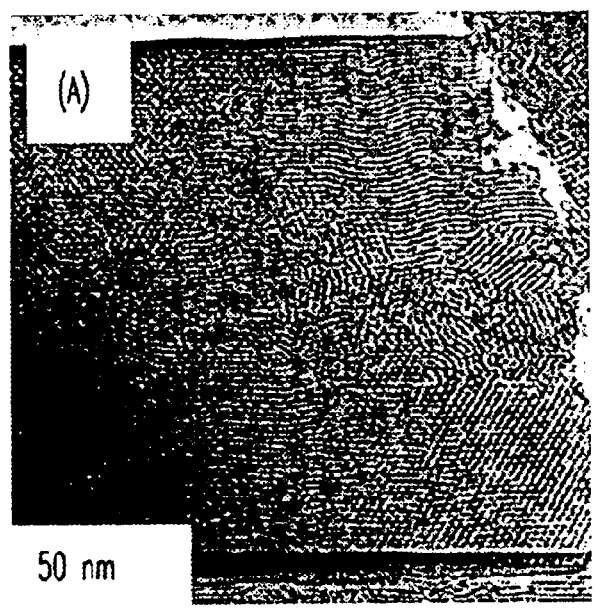
FIG. 10A is a TEM micrograph of a mesophase prepared using the method of the present invention.
Figure 10B:
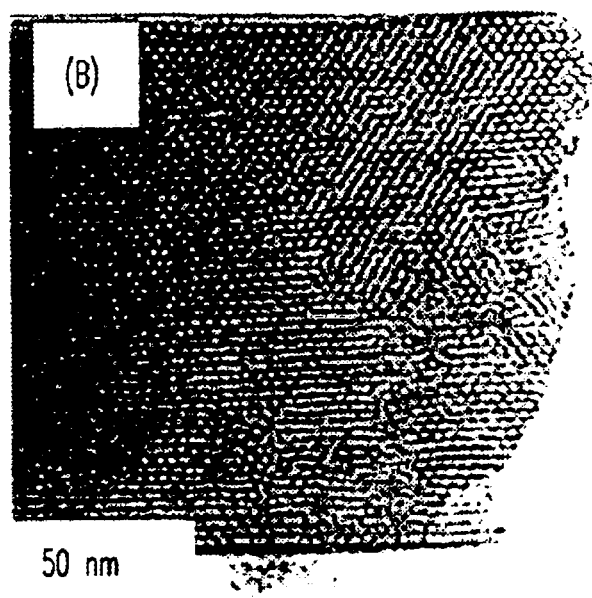
FIG. 10B is a TEM micrograph of another mesophase prepared using the method of the present invention.
Figure 10C:
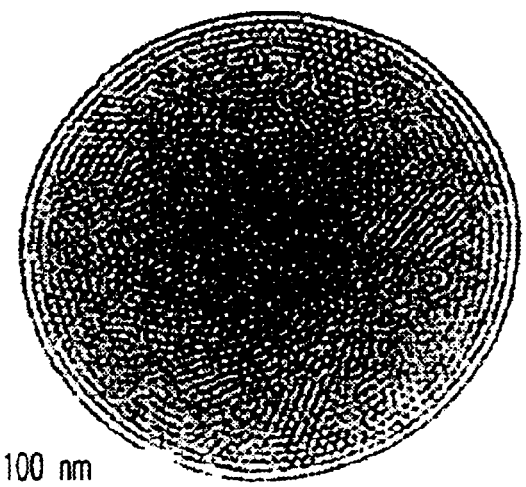
FIG. 10C is a TEM micrograph of another mesophase prepared using the method of the present invention.
Figure 10D:
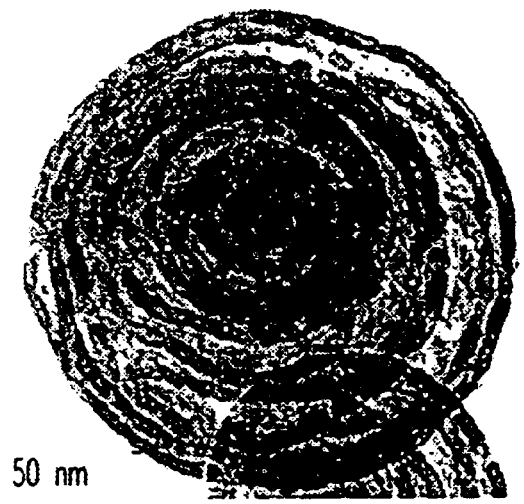
FIG. 10D is a TEM micrograph of another mesophase prepared using the method of the present invention.

TEM micrographs of calcined thin-film specimens evaluated by XRD are shown in FIGS. 10A–D. The striped and hexagonal close-packed textures observed for the 6 wt % CTAB-derived film as shown in FIG. 10A are characteristic of a one-dimensional hexagonal mesophase with d-spacing ≅3.3–3.5 nm, consistent with XRD results. Interestingly, undulations and defects in the stripe pattern in a plane normal to the substrate surface were observed, whereas for hexagonal thin-film mesophases prepared from TEOS these features were observed only in planes parallel to the substrate surface. FIG. 10B shows a cross section of the film prepared with 4 wt % Brij-56. Based on the hexagonal pattern of spots and the 5.3-nm spot-to-spot spacing, the upper right region was interpreted as a [111] orientation of a face-centered cubic structure with a ≅9.1–9.3 nm, consistent with XRD results and previous cubic thin-film mesophases prepared from Brij-56 and TEOS. FIG. 10C shows the TEM micrograph of a calcined spherical nanoparticle prepared using the phenylene-bridged precursor 2 of Table 1 of FIG. 6 with 7 wt % P123 block copolymer surfactant. Regions adjacent to the particle circumference, which correspond to the thinnest regions of the specimen in the imaging direction, exhibit a hexagonal close-packed texture. This structure was interpreted as a hexagonal mesophase composed of close-packed cylindrical pore channels aligned parallel to the particle circumference. This orientation arises from the initial nucleation of the hexagonal mesophase at the air-liquid interface and its growth inward, driven by an evaporation-induced radial concentration gradient. On the other hand, particles prepared from the comparable TEOS/7 wt % P123 system exhibit a multilamellar vesicular mesostructure. FIG. 10D shows the TEM micrograph of calcined spherical nanoparticles prepared using precursor 3 of Table 1 of FIG. 6 with 7 wt % P123 block copolymer surfactant. This multilamellar vesicular structure is composed of concentric bridged polysilsesquioxane layers containing integral vinyl functionality.

In combination with TEM results discussed above, the major peak in the CTAB system FIG. 9 were interpreted as the (100) reflection of a one-dimensional hexagonal mesophase with d=3.4 nm. The major XRD peak in the Brij56 system may be interpreted as a (200) reflection of a cubic mesophase with a=9.2 nm.

Figure 11:
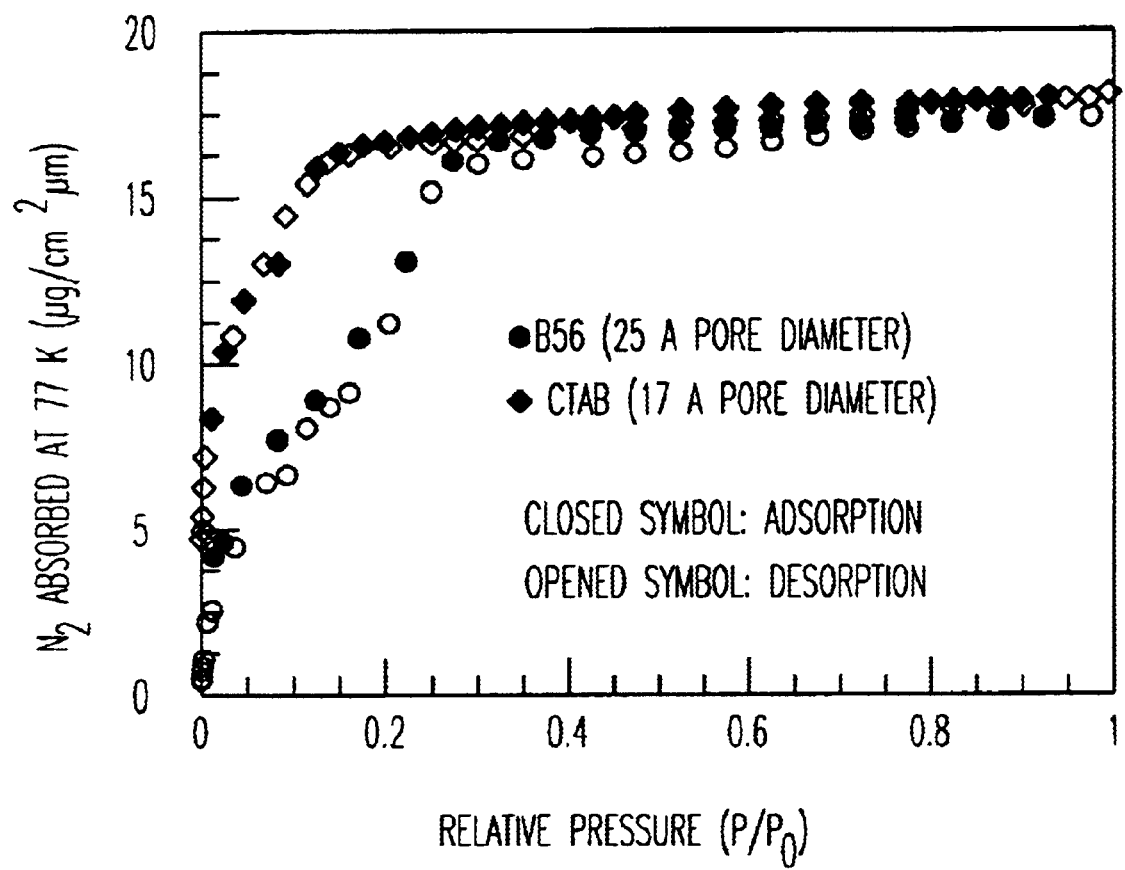
FIG. 11 shows a surface acoustic wave based nitrogen sorption isotherm of the calcined thin-film mesophase prepared using two different surfactants using the method of the present invention.

The porosity of the thin-film specimens prepared from 1 with 6 wt % CTAB or 4 wt % Brij-56 was characterized by nitrogen sorption measurements performed on film specimens using a surface acoustic wave (SAW) technique. The SAW $N_2$ sorption isotherms shown in FIG. 11 are qualitatively consistent with those previously obtained for the corresponding TEOS-derived films and typical of surfactant-templated mesophases in general. Based on a cylindrical pore model, the ratio of the thickness-normalized pore volume and surface area to calculate hydraulic pore diameters of 1.7 and 2.5 nm were used, respectively, for the CTAB and Brij-56 films. Retention of the bridging organic ligands in the calcined specimens was confirmed using $^{13}$C and $^{29}$Si MAS NMR spectroscopy. For powders prepared from organosilane 1 of Table 1 of FIG. 6 with 6 wt % CTAB, a large $^{13}$C resonance at 5.2 ppm, corresponding to the ethylene bridge, and a very broad $^{29}$Si resonance at −57.5 ppm, corresponding to trifunctional (T) silicons was observed. There was no evidence of tetrafunctional Q silicons at −101 or −107 ppm, implying complete retention of the bridging ligands. For the phenylene-bridged system prepared from 2 with 7 wt % P 123, a $^{13}C$ resonance at 133.4 ppm corresponding to the phenylene bridge and $^{29}Si$ resonances at −61.0 and −67.2 ppm, corresponding to $T^2$ and $T^3$ species, respectively (where the superscript denotes the number of bridging oxygens covalently bonded to the trifunctional silicon center) was observed. Again, there was no evidence of Q silicons.

To begin to establish structure-porosity relationships, a series of films from TEOS and organosilane 1 of Table 1 of FIG. 6 (n=2) with molar ratios TEOS:organosilane 1 65:25 ($TB_1$), 50:50 ($TB_2$), and 25:65 ($TB_3$) were observed. Synthesis and processing procedures were chosen to create isotropic disordered or wormlike thin-film mesophases with comparable film thicknesses that was measured by spectroscopic ellipsometry and porosities that were measured by analyses of SAW-based $N_2$ sorption isotherms. After calcination at 350° C. under $N_2$ to remove the surfactant templates, all films were vapor-treated with hexamethyldisilazane to avoid water adsorption. Table 2 of FIG. 12 compares values of the dielectric constants that were measured using a standard capacitance-voltage technique employing a mercury probe, Young's modulus, and hardness. Young's modulus and hardness were calculated from nanoindentation measurements at a constant indentation depth, assuming a Poisson ratio of 0.2. A consistent trend of increasing modulus and hardness and decreasing dielectric constant with substitution of the bridged silsesquioxane (≡Si—$CH_2$)$_2$—Si≡) for siloxane (≡Si—O—Si≡) in the framework was observed. This preliminary evidence suggested that introduction of integral organic groups into the frameworks of mesoporous materials can result in synergistic properties, promising an unprecedented ability to tune properties and function. The trend of increasing mechanical performance and decreasing dielectric constant observed here is of immediate and crucial interest to the burgeoning field of low-k dielectrics.

EXAMPLE 3
Micro-Pen Lithography MPL of a Surfactant-Templated Mesophase.

FIGS. 7A and 7B schematically illustrates direct writing of a mesoscopically ordered nanostructure, using micro-pen lithography MPL. Micro-pen lithography MPL of a surfactant-templated mesophase.

FIG. 7A shows the initially homogeneous sol metered on to the moving substrate experiences preferential evaporation of alcohol creating a complex 3-D (longitudinal and radial) gradient in the concentrations of water and non-volatile surfactant and silicate species. Progressive enrichment of silica and surfactant induces micelle formation and subsequent growth of silica/surfactant mesophases inward from the liquid-vapor interface as recently demonstrated for aerosols.

FIG. 7B shows the simulation of 3-D, binary fluid pattern dispensed on a flat substrate with pen orifice 50.0 μm. substrate speed=2.5 cm/s and fluid injection rate (inlet velocity) 4.0 cm/s. Color contours represent evaporation-induced, 3-D gradients in alcohol-composition. Residence times for fluid elements entering at the pen orifice and exiting at section 3 ranged from 0.23–0.30-ms. Fluid was modeled as 54 volume % ethanol and 46 volume % non-volatile phase with Reynolds number 1.25 and Ca=0.000733. An ad hoc value of 45 was chosen for the static contact angle. This angle persists at all points on the dynamic contact line because of the dominance of surface tension at this low value of Ca.

The numerical method utilized for FIGS. 7A and 7B consisted of a 3D finite element discretization of the Navier Stokes equations augmented with a three dimensional boundary-fitted mesh motion algorithm to track the free surface. Special relations at the 3D dynamic wetting line were also applied.

EXAMPLE 4

Figure 13A:
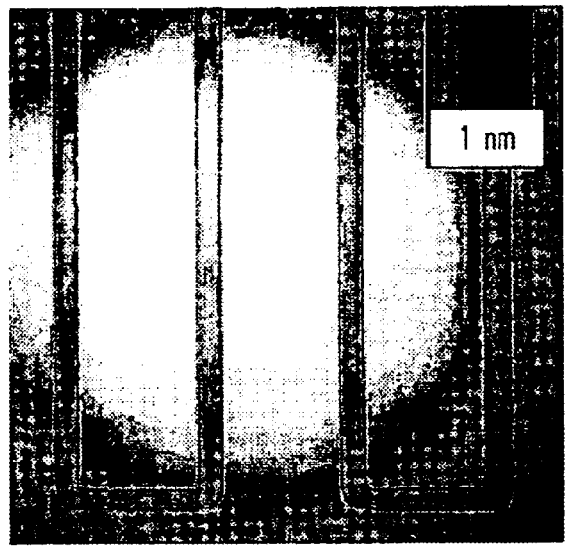
FIG. 13A is an optical micrograph of patterned rhodamine-B containing silica mesophase made according to the method of the present invention.

Direct writing of a mesoscopically ordered nanostructure, using micro-pen lithography MPL of the present invention was used to create the meandering patterned mesophase containing rhodamine B. FIG. 13A shows the optical micrograph of patterned rhodamine-B containing silica mesophase deposited on an oxidized [100]-oriented silicon substrate at a speed of 2.54 cm/s. FIG. 13A shows a macroscopic pattern formed in several seconds by MPL of a rhodamine B-containing solution on a hydrophilic surface. The inset in FIG. 13A shows the corresponding fluorescence image of several adjacent stripes acquired through a 610-nm band pass filter, demonstrating retention of rhodamine-B functionality.

Figure 13B:
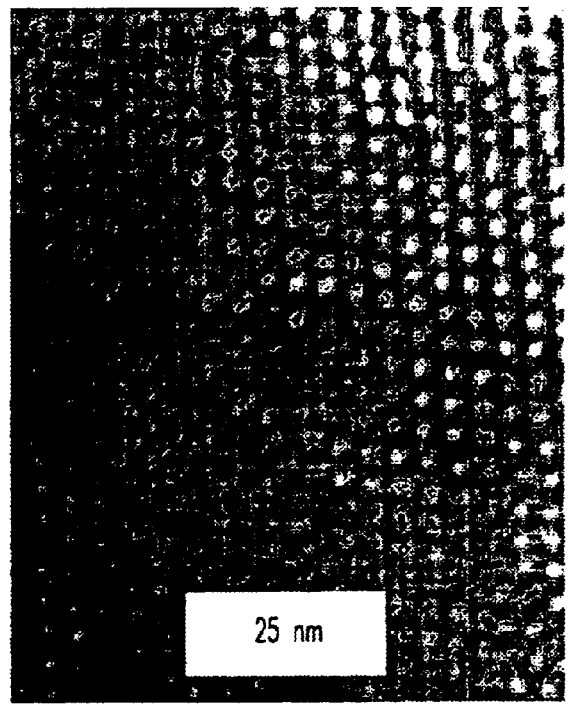
FIG. 13B is a representative TEM micrograph of a fragment of a patterned rhodamine-B containing film made according to the method of the present.

FIG. 13B shows a representative TEM micrograph of a fragment of the patterned rhodamine-B containing film corresponding to a [110]-oriented cubic mesophase with lattice constant a=10.3 nm. The TEM micrograph reveals the ordered pore structure characteristic of a cubic thin film mesophase.

The sol for this experiment was prepared according to the method of present invention by adding 0.01 wt % rhodamine-B to a silica/4 wt % Brij-56 sol. The TEOS:EtOH:water:HCl:Brij-56:rhodamine-B molar ratio= 1:22:5.0:0.004:0.065:2.6×10$^{-5}$.

EXAMPLE 5

Figure 14A:
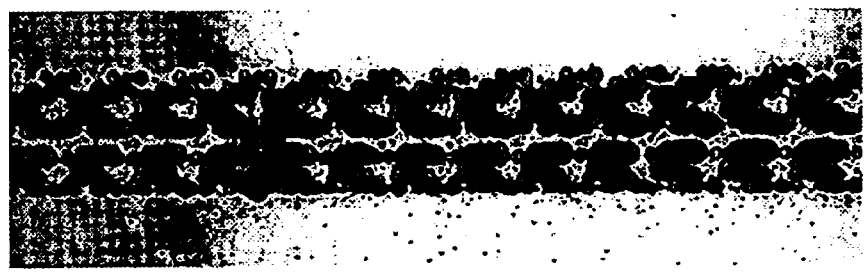
FIG. 14A is an optical micrograph of a dot array created by ink jet printing of standard ink on a non adsorbent surface in accordance with the method of the present invention.
Figure 14B:
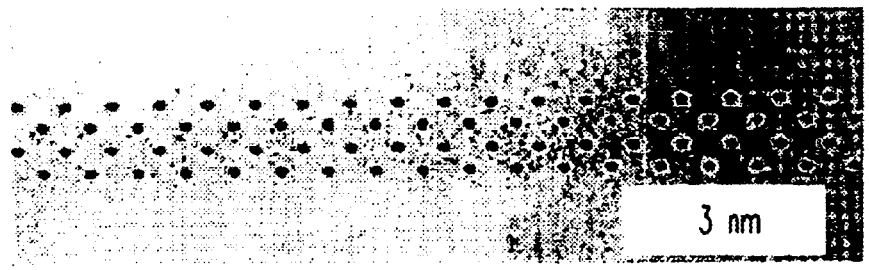
FIG. 14B is an optical micrograph of an array of hydrophobic, mesoporous silica dots created by evaporation-induced silica/surfactant self-assembly during ink jet printing according to the method of the present invention.
Figure 14C:
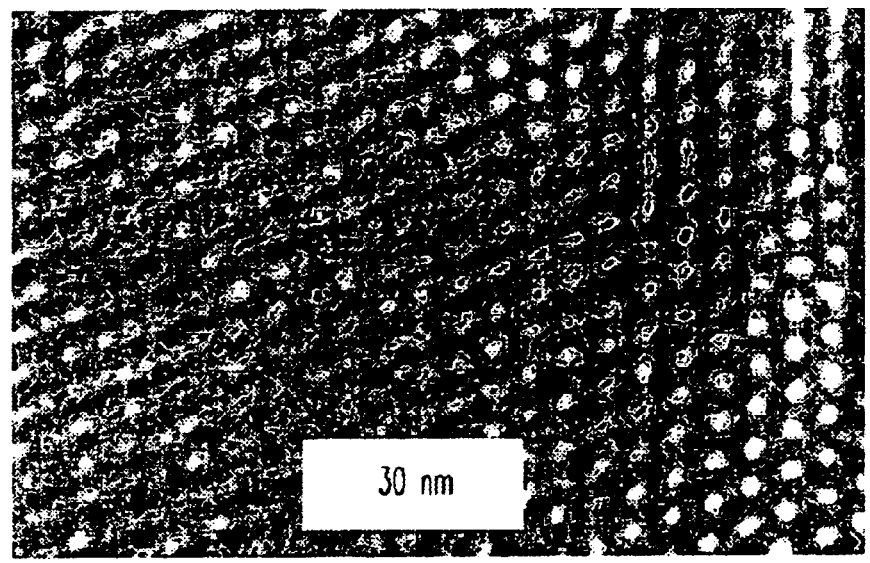
FIG. 14C shows an optical micrograph of an array of hydrophobic, mesoporous silica dots created by evaporation-induced silica/surfactant self-assembly during ink jet printing according to the method of the present invention.

FIGS. 14A, 14B, and 14C shows patterned dot arrays created by inkjet printing. A comparison is done of the patterns created using standard ink on a non adsorbent surface using IJP with the dots created by EISA of the present invention during IJP. Mesoporous spots formed on a silicon substrate by IJP in FIGS. 14B-C are an array of hydrophobic spots made with of a TFTS(1)-modified coating composition of the present invention.

FIG. 14A shows an optical micrograph of a dot array created by ink jet printing of standard ink (from Hewlett-Packard Co., San Diego, Calif.) on a non-adsorbent surface. The resolution is not as good as compared to the dot array seen in FIG. 14B.

FIG. 14B is an optical micrograph of an array of hydrophobic, mesoporous silica dots created by evaporation-induced silica/surfactant self-assembly using the coating solution of the present invention during IJP on an oxidized [100]-oriented silicon substrate followed by calcination.

A dot fragment prepared as in FIG. 14B was analyzed by TEM. The TEM micrograph in FIG. 14C shows the ordered mesoporosity of a calcined, fluoroalkylated silica mesophase formed by IJP.

The sol was prepared with molar ratio TEOS:TFTS(1) :EtOH:water:HCl:Brij-56 1:0.05:22.0:5.0:0.004:0.065.

The dot pattern used in FIG. 14A and FIG. 14B was designed using Microsoft PowerPoint 97 software. The printing rate was approximately 70 dots/s and printer resolution 300 dots/inch. The resolution achieved compared to standard ink and the present invention's ability to selectively functionalize the coating composition suggest applications in display technologies.

EXAMPLE 6
Formation of a Patterned Propyl-Amine(3)-Derivatized Cubic Mesophase by Selective De-Wetting Followed by Calcination to Remove the Surfactant Templates.

Using micro-contact printing or electrochemical desorption techniques, substrates were prepared with patterns of hydrophilic, hydroxyl-terminated SAMs and hydrophobic methyl-terminated SAMs. These substrates were used for the experiment described in FIG. 8. As shown in FIG. 8 preferential ethanol evaporation during dip-coating caused water enrichment and selective de-wetting of the hydrophobic SAMs. Correspondingly film deposition occurred exclusively on the patterned hydrophilic SAMs. The sol was prepared by adding aminopropyltrimethoxysilane ($NH_2(CH_2)_3Si(OCH_3)_3$, APS) to a silica/4 wt % Brij-56 sol, resulting in a final molar ratio of TEOS:APS:EtOH:water:HCl:Brij-56= 1:0.7:22:5.0:0.011:0.065. Selective de-wetting followed by calcination resulted in a patterned, amine-functionalized, cubic mesoporous film as is evident from the plan-view TEM micrograph, inset A in FIG. 8, showing a [100]-oriented cubic mesophase with a=10.3 nm and nitrogen adsorption-desorption isotherm as shown in inset B and curve a of FIG. 8 acquired for the thin film specimen using a surface acoustic wave (SAW) technique. The TEM micrograph and surface-acoustic wave-based $N_2$-sorption isotherm provide evidence of the mesostructural order and proof of the accessibility of the mesoporosity to the vapor phase. The dye conjugation reaction was conducted by immersion in a 0.00002 mM solution of 5,6-FAM, SE (listed in Table 1 of FIG. 6) prepared in dimethylsulfoxide (DMSO) followed by exhaustive, successive washing in DMSO, ethanol, and water. The SAW-based nitrogen adsorption-desorption isotherm of the dye-conjugated mesoporous film is shown in inset B, curve b, confirming its pore accessibility. BET (Brunauer-Emmett-Teller) analyses of the sorption isotherms indicate that the dye conjugation reaction reduces the surface area from 650 to 545 $m^2/g$ and the hydraulic radius from 2.2 to 2.1 nm, but pore accessibility is completely retained as evident from combined TEM, SAW, and fluorescent-imaging results.

In order to make a pH-sensitive fluidic system, the covalently bound propyl-amine ligands were conjugated with a pH-sensitive dye, 5,6-carboxyfluorescein, succinimidyl ester (5,6-FAM, SE) introduced in the pore-channel network of the cubic mesophase. After removal of any non-covalently-bonded dye, the uniform, continuous porosity of the amine-derivatized and dye-conjugated films was confirmed by TEM and the corresponding SAW-based nitrogen sorption isotherm FIG. 8, Inset B. The slight reduction in film porosity after dye conjugation reflects the volume occupied by the attached dye moieties. The patterned, dye-conjugated array was used to monitor the pH of fluids introduced at terminal pads and transported by capillary flow into an imaging cell FIG. 8.

EXAMPLE 7
Patterned pH-Sensitive Fluidic System.

Figure 15A:
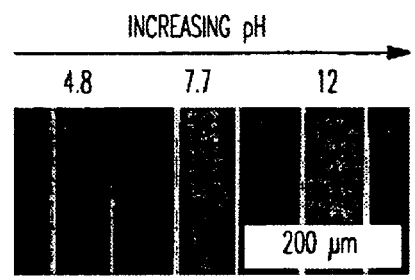
FIG. 15A is a fluorescence image of three adjacent 5,6 FAM, SE-conjugated pore channel networks after introduction of aqueous solutions prepared at pH 4.8, 7.7, and 12.0.

FIG. 15A shows a fluorescence image of three adjacent 5.6-FAM, SE-conjugated pore channel networks after introduction of aqueous solutions prepared at pH 4.7, 6.6, or 120. Patterned dye-conjugated thin film mesophases were prepared as described above in example 5. Aqueous solutions of varying pH were introduced on the terminal pads FIG. 8 and transported into the imaging cell by capillary flow. Image was acquired using a Nikon Diaphot 300 inverted microscope and 520 nm band pass filter.

Figure 15B:
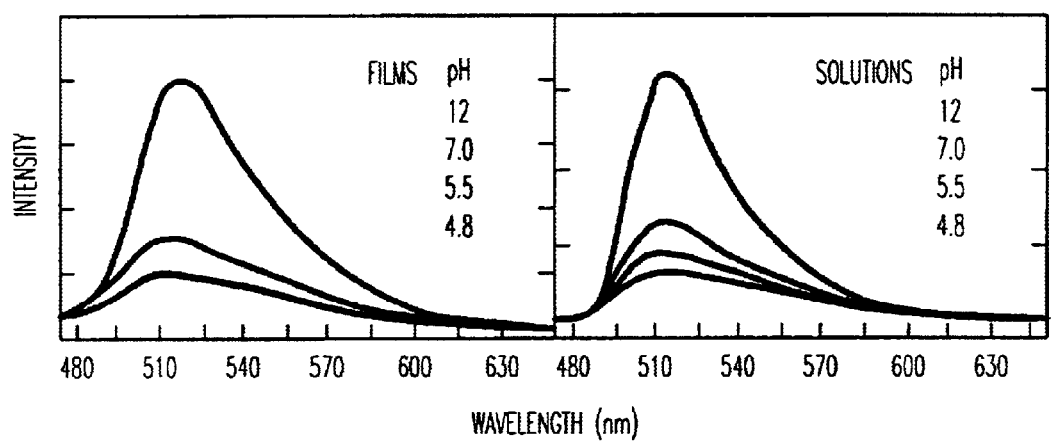
FIG. 15B is a fluorescence spectra of 5,6 FAM, SE-conjugated mesoporous films made according to the method of the present invention upon exposure to aqueous solutions prepared at pH 4.8, 7.7, or 12.0 and a fluorescence spectra of 0.1 µm solutions at the corresponding pH's for comparison.

FIG. 15B shows the corresponding fluorescence emission spectra of an array of 5,6-FAM, SE-conjugated mesoporous films upon exposure to aqueous solutions of pH 4.7, 6.6, and 12.0. Shown for comparison are fluorescence spectra of 0.1 micromolar solutions of 5,6-FAM, SE prepared in aqueous solutions of pH 4.7, 6.6, and 12.0. The similarity of the two sets of spectra confirms the maintenance of dye functionality upon conjugation within the mesoporous channel system.

Figure 15C:
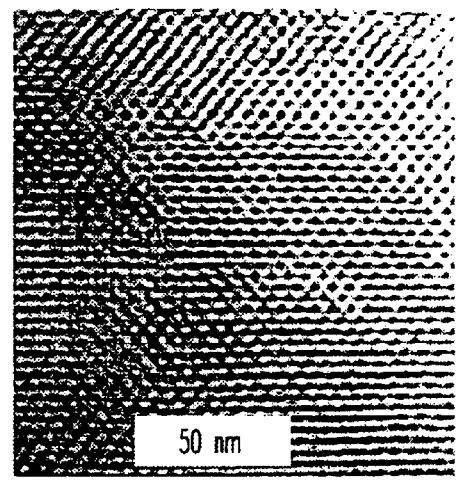
FIG. 15C is a cross-sectional TEM micrograph of the patterned, dye conjugated thin film mesophase, providing evidence of the 3-D pore channel network in the film made according to the method of the present invention.

FIG. 15C shows a cross-sectional TEM micrograph of the patterned, dye-conjugated thin film mesophase, providing evidence of the 3-D pore channel network.

Comparison with solution data FIG. 15B indicates that dye molecules covalently attached to the mesoporous framework retain similar functionality to those in solution. The combined fluorescence image as shown in FIG. 15A and cross-sectional TEM micrographs shown in FIG. 15C, of the patterned dye-conjugated film demonstrate the uniformity of macro- and mesoscale features achievable by this evaporation-induced, de-wetting and self-assembly route. In comparison, films formed slowly (2–24 hours) by nucleation and growth of thin film mesophases on patterned SAMs were observed to have non-homogeneous, globular morphologies unsuitable for fluidic or photonic systems. It is also noteworthy that in this case the mesoporous film formed on the hydrophobic regions.

EXAMPLE 7

Functional organosilanes listed in Table 1 of FIG. 6 were incorporated in the mesophase thin films using the method of the present invention. The pore sizes and surface area were determined from $N_2$ sorption isotherms obtained at $-196°$ C., using a surface acoustic wave (SAW) technique. Mass change due to nitrogen sorption was monitored at ~70 pg.cm² sensitivity as a function of nitrogen relative pressure. Pore size and surface area were determined from the isotherms using the BET equation and the BJH algorithm, respectively. Functional groups were retained through selective surfactant removal during heat treatment in nitrogen. TGA and DTA were used to establish the appropriate temperature window enabling complete surfactant removal without silane decomposition. Five different additives were investigated including rhodamine-B, cytochrome c (from Fluka), oil blue N, disperse yellow 3 (from Aldrich), silver ions and silver nanoparticles. Dye molecule (5,6-carboxyfluorecein succinimidyl ester (5,6-FAM,SE) from Molecular Probes) was conjugated to a thin film mesophase containing aminopropyltrimethoxysilane (APS) to form organosilane 4 in Table 1 of FIG. 6.

Thin film mesophases containing 3 dimensional networks having 25 Å pore size with a surface area of 750 $m^2/g$ made with TFTS are hydrophobic and may be useful in low k dielectrics applications such as computer chips Thin film mesophases containing 3 dimensional networks having 25 Å pore size with a surface area of 1060 $m^2/g$ made with MPS are useful for coupling of noble metals and may be useful for applications such as cleaning of noble metal contaminated water.

Thin film mesophases containing cubic patterns having 22 Å pore size with a surface area of 650 $m^2/g$ made with APS are useful for coupling of noble metals, dye, and bioactive molecules and may be useful for applications such as fabrication of sensors.

Thin film mesophases containing cubic patterns having 21 Å pore size with a surface area of 545 $m^2/g$ made by conjugating 5,6-FAM, SE dye molecule to APS are useful for sensing the pH changes and may be useful for applications such as microfluidic sensors.

Thin film mesophases containing 3 dimensional networks having 22 Å pore size with a surface area of 560 $m^2/g$ made with organosilane 5 of Table 1 of FIG. 6, 3-(2,4,-dinitrophenylamino)propyltriethoxysilane.may be serve as chromphores or a non-linear optical materials.

Thin film mesophases containing cubic patterns having 40 Å pore size with a surface area of 430 $m^2/g$ made with ethane-bridged silsesquioxane, have low k dielectric properties and may be useful for applications such as computer chips Rhodamine containing mesophases (refractive index n=1.2–1.3) on aerogel and emulsion-templated thin films (n=1.03–1.10) have been written using CAD and MPL. The resulting mesophases are useful for directly defining optical wave-guide structures potentially useful for lasing.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A film comprising:
   a layer having hydrophilic and hydrophobic patterns on a substrate; and
   a patterned silsequioxane layer substantially deposed exclusively on and contacting the hydrophilic pattern, the patterned silsequioxane layer exhibiting structure and function on at least two length scales made by a film-forming method, said method comprising:
      providing at least one coating composition comprising:
         TEOS;
         a surfactant;
         at least one organosilane;
         HCl;
         water; and
         ethanol;
      applying said coating composition on the layer having hydrophilic and hydrophobic patterns to form a patterned coating; and
      drying said patterned coating to form the patterned silsequioxane film exhibiting structure and function on at least two length scales.

2. The film of claim 1, wherein said organosilane comprises tridecafluoro-1,1,2,2-tetrahydrooctylriethyoxysilane.

3. The film of claim 1, wherein said organosilane comprises mercaptopropyltrimethyoxysilane.

4. The film of claim 1, wherein said organosilane comprises an aminoorganosilane.

5. The film of claim 1, wherein said organosilane comprises 3-(2,4-dinitrophenylamino)propyltriethoxysilane.

6. The film of claim 1, wherein said coating composition further comprises a dye.

7. The film of claim 6, wherein said dye comprises rhodamine B.

8. The film of claim 1, wherein said surfactant comprises a cationic surfactant.

9. The film of claim 8, wherein said cationic surfactant comprises cetyl trimethyl ammonium bromide.

10. The film of claim 1, wherein said surfactant comprises a nonionic surfactant.

11. The film of claim 10, wherein said nonionic surfactant comprises polyoxyethylene cetyl ether.

12. The film of claim 1, wherein said surfactant comprises an anionic surfactant.

13. The film of claim 1, wherein said coating composition is coated on said substrate by dip coating.

14. The film of claim 1, wherein said coating composition is coated on said substrate by micro-pen lithography.

15. The film of claim 1, wherein said coating composition is coated on said substrate by ink jet printing.

16. The film of claim 15, wherein said at least one coating composition comprises a plurality of coating compositions and wherein each of said plurality of coating compositions is stored separately from each other prior to coating each of said plurality of coating compositions on a substrate.

17. The film of claim 1, wherein providing said coating composition comprises heating an initial composition comprising TEOS, ethanol, water and HCl at a temperature of at least 60° C. for at least 90 minutes.

18. The film of claim 17, wherein said initial composition contains TEOS, ethanol, water and HCl in the mole ratio of $1:3:7:1.5 \times 10^{-5}$.

19. The film of claim 17, wherein providing said coating composition further comprises diluting said initial composition with ethanol to provide an ethanol-diluted composition.

20. The film of claim 19, wherein said initial composition is diluted with 2 volumes of ethanol for every 1 volume of initial composition.

21. The film of 19, wherein providing said coating composition further comprises diluting said ethanol-diluted composition with water and HCl to provide an acidic sol.

22. The film of claim 21, wherein providing said coating composition further comprises adding said at least one organosilane to said acidic sol to form a proto-composition.

23. The film of claim 22, wherein providing said coating composition further comprises adding said surfactant to said proto-composition to form said coating composition.

24. The film of claim 23, wherein said surfactant is present in said coating composition at a concentration of 0.04 to 0.23 M.

25. The film of claim 24, wherein providing said coating composition further comprises adding at least one organic additive to said acid sol.

26. The film of claim 1, wherein said coating composition comprises Si:ethanol:water:HCl:surfactant:organosilane in a mole ratio of 1:22:5:0.004:0.093–0.31:0.039–0.8.

27. The film of claim 1, wherein said coating is dried at a temperature of 25° C. to 100° C.

28. The film of claim 1, further comprising removing substantially all of said surfactant from said film.

29. The film of claim 28, wherein said surfactant is removed by heating said film at a temperature of at least 300° C.

30. The film of claim 1, further comprising vapor-treating said film with hexamethyldisilazane.

31. The film of claim 1, wherein said film is mesoporous.

32. The film of claim 1, wherein said film has a thickness of 50 nm–1 $\mu$m.

33. A film made by a film-forming method, said method comprising:
   providing at least one coating composition comprising:
      TEOS;
      a surfactant;
      at least one organosilane;
      HCl;
      water; and
      ethanol;
   applying said coating composition on a substrate to form a coating on said substrate; and
   drying said coating to form a patterned silsequioxane film, wherein said organosilane comprises aminopropyltnmethoxysilane.

34. The film of claim 33, wherein said coating composition further comprises a dye coupled to aminopropyltrimethoxysilane.

35. A film made by a film-forming method, said method comprising:
   providing at least one coating composition comprising:
      TEOS;
      a surfactant;
      at least one organosilane;
      HCl;
      water; and
      ethanol;

applying said coating composition on a substrate to form a coating on said substrate; and drying said coating to form a patterned silsequioxane film, wherein said organosilane comprises $(H_5C_2O)_3SiCH_2CH_2Si(OC_2H_5)_3$.

36. A film made by a film-forming method, said method comprising:
   providing at least one coating composition comprising:
      TEOS;
      a surfactant;
      at least one organosilane;
      HCl;
      water; and
      ethanol;
   applying said coating composition on a substrate to form a coating on said substrate; and
   drying said coating to form a patterned silsequioxane film, wherein said surfactant comprises an anionic surfactant, wherein said anionic surfactant comprises sodium dodecyl sulfate.

37. A film made by a film-forming method, said method comprising:
   providing at least one coating composition comprising:
      TEOS;
      a surfactant;
      at least one organosilane;
      HCl;
      water; and
      ethanol;
   applying said coating composition on a substrate to form a coating on said substrate; and
   drying said coating to form a patterned silsequioxane film, wherein said coating composition comprises Si:ethanol:water:HCl:surfactant:organosilane:organic additive in a mole ratio of $1:22:5:0.004:0.093–0.31:0.039–0.8:2.6\times10^{-5}$.

38. A film made by a film-forming method, said method comprising:
   providing at least one coating composition comprising:
      TEOS;
      a surfactant;
      at least one organosilane;
      HCl;
      water; and
      ethanol;
   applying said coating composition on a substrate to form a coating on said substrate; and
   drying said coating to form a patterned silsequioxane film, wherein said at least one organosilane comprises $(H_5C_2O)_3SiCH_2CH_2Si(OC_2H_5)_3$ and said coating composition comprises Si:EtOH:$H_2$O:HCl surfactant in a mole ratio $1:22:5:0.004:(0.054–0.18)$.

* * * * *

UNITED STATES PATENT AND TRADEMARK OFFICE
CERTIFICATE OF CORRECTION

PATENT NO. : 6,913,832 B2
DATED : July 5, 2005
INVENTOR(S) : Fan et al.

It is certified that error appears in the above-identified patent and that said Letters Patent is hereby corrected as shown below:

Title page,
Item [73], Assignee, delete "at" and insert -- @ --, therefor.
Item [56], References Cited, OTHER PUBLICATIONS, "Brinker et al.," reference, after "Assembly" insert -- : --.

Column 22,
Lines 55-56, delete "aminopropyltnmethoxysilane" and insert
-- aminopropyltrimethoxysilane --, therefor.

Signed and Sealed this

Twentieth Day of September, 2005

JON W. DUDAS
*Director of the United States Patent and Trademark Office*